United States Patent
Hayashi et al.

(10) Patent No.: US 7,476,590 B2
(45) Date of Patent: Jan. 13, 2009

(54) METHOD OF MANUFACTURING SEMICONDUCTOR DEVICE

(75) Inventors: Tetsuya Hayashi, Yokosuka (JP); Masakatsu Hoshi, Yokohama (JP); Yoshio Shimoida, Yokosuka (JP); Hideaki Tanaka, Yokohama (JP)

(73) Assignee: Nissan Motor Co., Ltd., Kanagawa-ken (JP)

( * ) Notice: Subject to any disclaimer, the term of this patent is extended or adjusted under 35 U.S.C. 154(b) by 496 days.

(21) Appl. No.: 11/231,799

(22) Filed: Sep. 22, 2005

(65) Prior Publication Data

US 2006/0068537 A1    Mar. 30, 2006

(30) Foreign Application Priority Data

| Sep. 28, 2004 | (JP) | ............................. 2004-280950 |
| Sep. 28, 2004 | (JP) | ............................. 2004-281661 |
| Sep. 28, 2004 | (JP) | ............................. 2004-281700 |

(51) Int. Cl.
*H01L 21/336* (2006.01)

(52) U.S. Cl. ............... 438/285; 438/590; 257/E21.066; 257/E21.447

(58) Field of Classification Search ................. 438/105, 438/285, 590, 931; 257/E21.066, E21.447
See application file for complete search history.

(56) References Cited

U.S. PATENT DOCUMENTS 6,002,143 A * 12/1999 Terasawa ..................... 257/77

FOREIGN PATENT DOCUMENTS

JP    2003-318398    11/2003

OTHER PUBLICATIONS

Takemura et al.; "Implantation of Al and B Acceptors into Alpha-SiC and pn Junction Diodes"; *Materials Science Forum*; c. 1998; vol. 264-268; pp. 701-704; Trans Tech Publications; Switzerland.

* cited by examiner

*Primary Examiner*—Chandra Chaudhari
(74) *Attorney, Agent, or Firm*—McDermott Will & Emery

(57) ABSTRACT

A method of manufacturing a semiconductor device having: forming a hetero semiconductor layer on at least the major surface of the semiconductor substrate body of a first conductivity type; etching the hetero semiconductor layer selectively by use of a mask layer having openings in way that the hetero semiconductor layer remains to be not etched with a predetermined thickness; oxidizing an exposed parts of the hetero semiconductor layer; forming the hetero semiconductor region by etching a oxidized film formed in the oxidizing; and forming the gate insulating film in a way that the gate insulating film makes an intimate contact with the hetero semiconductor region and the semiconductor substrate body. The bandgap of the hetero semiconductor layer is different from that of the semiconductor substrate body. The gate electrode is arranged in a junction part between the hetero semiconductor region and the semiconductor substrate body with the gate insulating film interposed between the gate electrode and the junction part.

11 Claims, 17 Drawing Sheets

METHOD OF MANUFACTURING SEMICONDUCTOR DEVICE

BACKGROUND OF THE INVENTION

In the prior art, an n⁻ polycrystalline silicon region and an n⁺ polycrystalline silicon region are formed on a major surface of a semiconductor substrate body in a way that the n⁻ polycrystalline silicon region and an n⁺ polycrystalline silicon region make an intimate contact with each other. The semiconductor substrate body is obtained by forming an n⁻ silicon carbide epitaxitial region on an n⁺ silicon carbide substrate. The epitaxial region, the n⁻ polycrystalline silicon region and the n⁺ polycrystalline silicon region form a hetero-junction among them. In addition, a gate electrode is formed adjacent to a junction part between the epitaxitial region and the n⁺ polycrystalline silicon region with a gate insulating film interposed between the gate electrode and the semiconductor substrate body. The n⁻ polycrystalline silicon region is connected to a source electrode. A drain electrode is formed on the back surface of the n⁺ silicon carbide substrate.

A semiconductor device configured in the aforementioned manner functions as a switch, if electric potential of the gate electrode is controlled while the source electrode is being grounded and a predetermined positive electric potential is being applied to the drain electrode. In other words, a reverser bias is applied to the hetero-junction among the n⁻ polycrystalline silicon region, the n⁺ polycrystalline silicon region and the epitaxitial region, while the gate electrode is being grounded. In addition, electric current dose not flow between the drain electrode and the source electrode. However, while the predetermined positive voltage is being applied to the gate electrode, a gate electric field works on a hetero-junction interface between the n⁺ polycrystalline silicon region and the epitaxitial region. This makes small a thickness of an energy barrier stemming from a hetero-junction surface of a gate oxidized film interface. For this reason, electric current flows between the drain electrode and the source electrode. In the prior art, the hetero-junction part is used as a channel for controlling shut-off and conductivity of the electric current. Accordingly, a channel length functions with a thickness of the hetero barrier. This makes it possible to obtain a conductivity characteristic with low resistance.

SUMMARY OF THE INVENTION

In the prior art, however, leakage current which is determined physically by the hetero-barrier height occurs in the hetero-junction part between the n⁻ polycrystalline silicon region and the n⁻ silicon carbide epitaxitial region and in the hetero-junction part between the n⁺ polycrystalline silicon region and the n⁻ silicon carbide epitaxitial region. This imposes a limitation on reduction in the leakage current.

In a case where a channel interface between the polycrystalline silicon region and the silicon carbide epitaxitial region is intended to be formed by patterning the polycrystalline silicon region which has been formed on the silicon carbide epitaxitial region, if a physical etching process, such as a dry etching process, is used, damage is caused on the etched parts of the surface of the silicon carbide epitaxitial region. This decreases the drive power while switching operations are performed.

The present invention has been made for the purpose of solving the problems with the prior art. An object of the present invention is to provide a semiconductor device as follows and a method of manufacturing the semiconductor device. The semiconductor device can easily provide a high-breakdown-voltage field effect transistor. The high breakdown-voltage field effect transistor can reduce the leakage current which occurs in parts of the hetero-junction interface, which parts are in the vicinity of the gate electrode, while the semiconductor device is placed in a shut-off state. The high breakdown-voltage field effect transistor can also secure the drive power equivalent to those of conventional semiconductor devices, while the semiconductor device is placed in a conductivity state.

Another object of the present invention is to provide a method of manufacturing a semiconductor device which can inhibit reduction in the drive power while the switching operations are performed.

An aspect of the present invention provide a method of manufacturing a semiconductor device, the method having: forming a hetero semiconductor layer on at least the major surface of the semiconductor substrate body of a first conductivity type; etching the hetero semiconductor layer selectively by use of a mask layer having openings in way that the hetero semiconductor layer remains to be not etched with a predetermined thickness; oxidizing an exposed parts of the hetero semiconductor layer; forming the hetero semiconductor region by etching a oxidized film formed in the oxidizing; and forming the gate insulating film in a way that the gate insulating film makes an intimate contact with the hetero semiconductor region and the semiconductor substrate body. The bandgap of the hetero semiconductor layer is different from that of the semiconductor substrate body. The gate electrode is arranged in a junction part between the hetero semiconductor region and the semiconductor substrate body with the gate insulating film interposed between the gate electrode and the junction part.

DETAILED DESCRIPTION OF THE PREFERRED EMBODIMENTS

Figure 1:
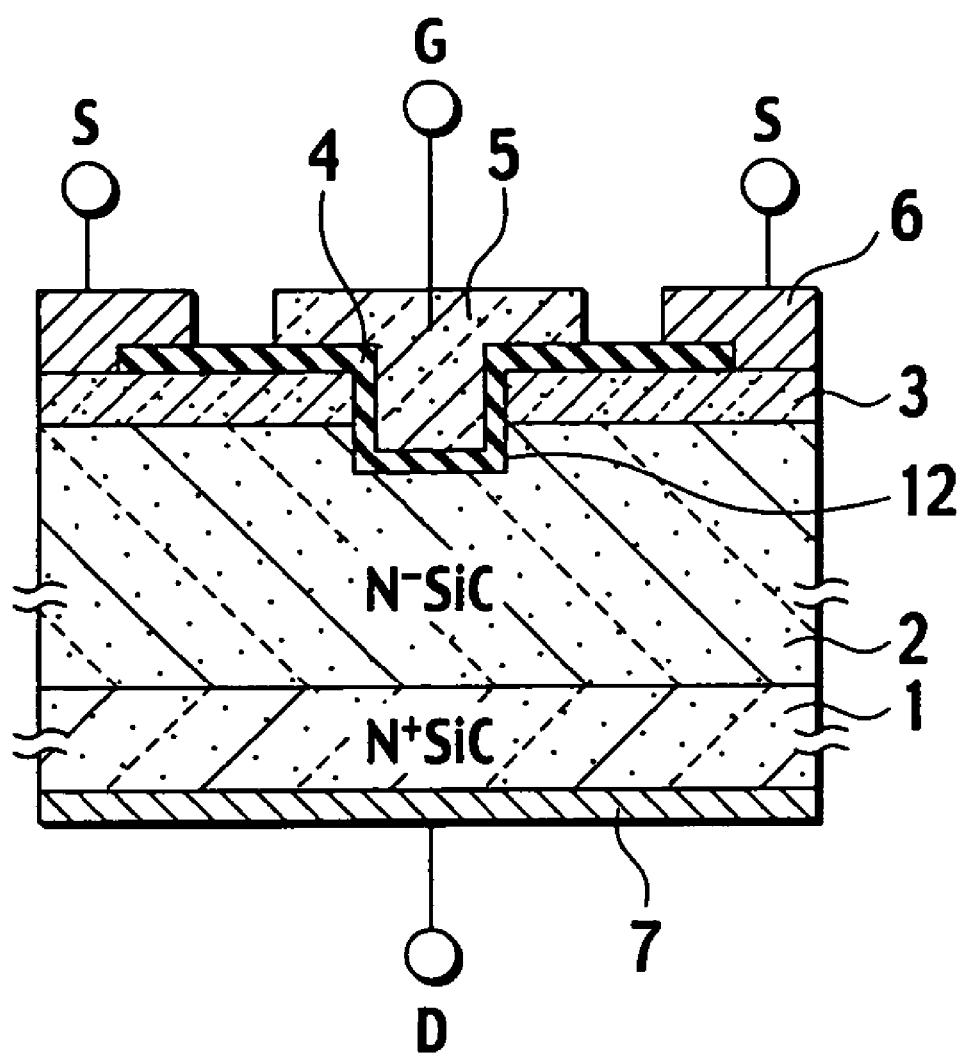
FIG. 1 is a cross-sectional view of a semiconductor device according to the first embodiment of the present invention.

Hereinafter, descriptions will be provided for the embodiment of the present invention with reference to the drawings. Incidentally, in the drawings below used for the descriptions, the same reference numerals and symbols will be used to designate components which have the same functions, and the descriptions will be omitted or simplified.

First Embodiment

<<Structure>>

FIG. 1 shows a first embodiment of a semiconductor device according to the present invention. FIG. 1 is a cross-sectional view of the semiconductor device in which two structural unit cells are opposite to each other. The first embodiment will be described, giving an example of a semiconductor device whose substrate material is silicon carbide (SiC).

A drain region 2 is formed on a silicon carbide substrate 1. The silicon carbide substrate is made, for example, of silicon carbide of the 4H type in terms of polytype, and is of $n^+$ type in terms of conductivity. The drain region is made of $n^-$ silicon carbide epitaxial layer. A first hetero semiconductor region 3 made, for example, of n– polycrystalline silicon makes an intimate contact with a main substrate, which is opposite to a junction surface between the drain region 2 and the substrate 1. In other words, a junction portion where the drain region 2 and the first hetero semiconductor region 3 are joined to each other is formed of a hetero-junction between silicon carbide and polycrystalline silicon, whose bandgaps are different from each other. An energy barrier exists in the junction interface. A gate insulating film 4 made, for example, of a silicon oxide film is formed in a way that a part of the gate insulating film 4 makes an intimate contact with the junction surface between the first hetero semiconductor region 3 and the drain region 2. In addition, a gate electrode 5 made of $p^+$ polycrystalline silicon is formed on the gate insulating film 4. A source electrode 6 is formed on an opposing surface opposite to the junction surface between the first hetero semiconductor region 3 and the drain region 2 in a way that the source electrode 6 is connected to the opposing surface. A drain electrode 7 is formed on the substrate 1 in a way that the drain electrode is connected to the substrate 1.

Figure 2:
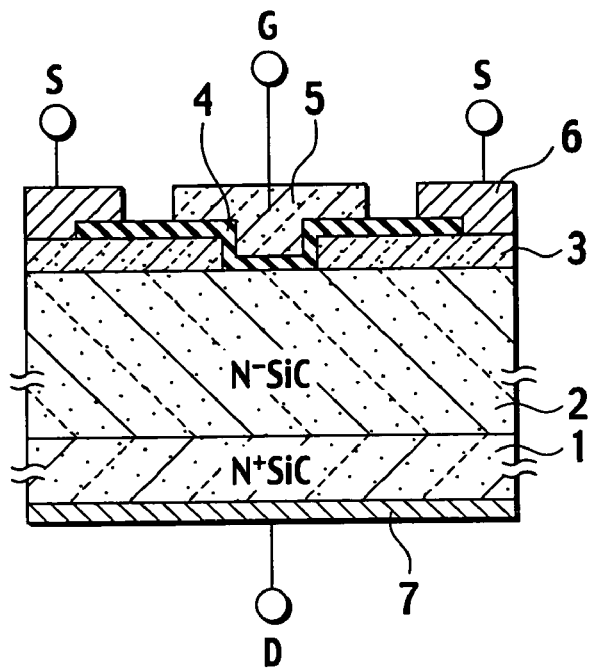
FIG. 2 is a cross-sectional view of a semiconductor device having what is termed as a planar-type structure, as a first modification of FIG. 1.
Figure 3:
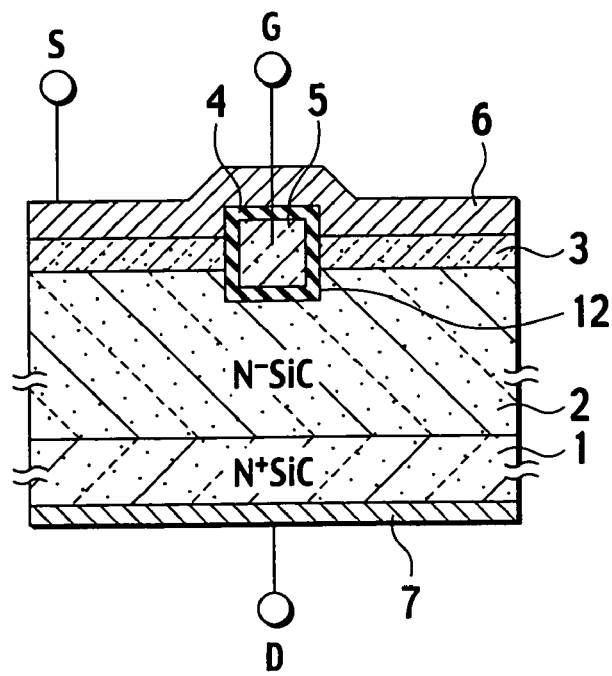
FIG. 3 is a cross-sectional view of a semiconductor device in which the first hetero semiconductor region and the entire surface of the source electrode is in full contact with each other, as a second modification of FIG. 1.

The descriptions have been provided for the semiconductor device according to the first embodiment, giving an example of what is termed as the trench-type structure as shown in FIG. 1. According to the trench-type structure, a groove 12 is formed in a surface portion of the drain region 2, and thereafter the gate electrode 5 is formed in the groove 12 with the gate insulating film 4 interposed between the gate electrode 5 and the inside surface of the groove 12. It should be noted, however, that the semiconductor device may have what is termed as a planar-type structure, according to which no groove is formed in the drain region 2 as shown in FIG. 2. In FIG. 1, a part of the first hetero semiconductor region 3 and a part of the source electrode 6 are in contact with each other through a predetermined contact hole. However, the first hetero semiconductor region 3 and the entire surface of the source electrode 6 may be in full contact with each other, as shown in FIG. 3.

<<Manufacturing Method>>

Descriptions will be provided for an example of a method of manufacturing the silicon carbide semiconductor device as shown in FIG. 1 according to the first embodiment of the present invention.

The $n^-$ drain region 2 is epitaxially grown on the $n^+$ silicon carbide substrate 1, and thus a $n^-$ silicon carbide semiconductor substrate body is formed. Then, a first polycrystalline silicon layer is deposited on the $n^-$ silicon carbide semiconductor substrate body, for example, by use of a LP-CVD process. Thereafter, the first polycrystalline silicon layer is doped with boron, for example, in a $POCl_3$ atmosphere, and thus a first $n^-$ polycrystalline silicon layer is formed. Incidentally, the first polycrystalline silicon layer may be formed by depositing polycrystalline silicon on the semiconductor substrate body, for example, by an electron beam vapor deposition process or a sputtering process or the like, and by thereafter re-crystallizing the deposited polycrystalline silicon by a laser annealing process. Otherwise, the first polycrystalline silicon layer may be formed of monocrystalline silicon which is hetero-epitaxially grown on the semiconductor substrate by a molecular beam epitaxy process or the like. In addition, a combination of an ion implantation process and a thermal activation process to be performed after the ion implantation process may be used for the doping process.

Thence, a mask layer is formed on the first polycrystalline silicon layer by use of a photolithography process and an etching process. Thereafter, the first polycrystalline silicon layer and the surface portion of the drain region 2 are etched through the mask layer, for example, by use of a reactive ion etching (dry etching) process. Thereby, the groove 12 with a predetermined depth is formed. Incidentally, another etching process, such as a wet etching process, may be used as a method of etching the polycrystalline silicon layer.

Subsequently, the gate insulating film 4 is deposited on the top surface of the first hetero semiconductor region 3 and along the inside surface of the groove 12. Then, a polycrystalline silicon layer which will later constitute the gate electrode 5 is deposited on the gate insulating film 4. Thereafter, boron is added into the polycrystalline silicon layer by use of a solid-phase diffusion process using $BBr_3$. When boron is intended to be added into the polycrystalline silicon layer, a combination of an ion implantation process and a thermal activation process to be performed after the ion implantation process may be used for this doping process. Then, the gate electrode 5 is formed by use of a photolithography process and an etching process. Thence, an interlayer dielectric (its illustration is omitted) is deposited. Subsequently, parts of the deposited interlayer dielectric and parts of the gate insulating film 4 are removed by use of a photolithography process and an etching process, and thus the contact hole is opened.

Finally, the drain electrode 7 made, for example, of titanium (Ti) and nickel (Ni) is formed on the back surface of the substrate 1. Titanium (Ti) and Nickel (Ni) are deposited sequentially on the first hetero semiconductor region 3 which is on the front surface of the substrate 1, and thereby the source electrode 6 is formed on the first hetero semiconductor region 3. Through these processes, the silicon carbide semiconductor device as shown in FIG. 1 according to the first embodiment of the present invention is completed.

As described above, the semiconductor device according to the first embodiment can be realized easily by use of the abovementioned manufacturing techniques.

<<Operations>>

Descriptions will be provided for operations of the silicon carbide semiconductor device. In the case of the first embodiment, the silicon carbide semiconductor device is used, for example, by grounding the source electrode 6 and by applying a positive electric potential to the drain electrode 7.

First of all, in a case where the gate electrode 5 is placed at a ground electric potential or a negative electric potential, a shut-off state is maintained. This is because an energy barrier against conductivity electrons is formed in the hetero-junction interface between the first hetero semiconductor region 3 and the drain region 2. In the case where the energy barrier is formed, a depletion layer spreads in the drain region 2 and the first hetero semiconductor region 3, each of which is connected to the gate electrode 5 with the gate insulating film 4 interposed between itself and the gate electrode 5, in accordance with the first embodiment. This is because the depletion layer occurs depending on the work function difference between the $p^+$ polycrystalline silicon, of which the gate electrode 5 is formed, and the $n^-$ silicon carbide of the drain region 2, and depending on the work function difference between the $p^+$ polycrystalline silicon, of which the gate electrode 5 is formed, and the $n^-$ type polycrystalline silicon of the first hetero semiconductor region 3. In this case, the larger a difference in impurity concentration between the gate electrode 5 and the drain region 2 is, the larger a width of the depletion layer spreading in the drain region 2 is. If the semiconductor device is configured in this manner, this reduces leakage current, which occurs in parts of a heterojunction interface between the drain region 2 and the hetero semiconductor region 3, which parts are in the vicinity of the gate electrode 5. Accordingly, such a configuration makes it possible to realize a higher shut-off performance than the conventional configurations.

In a case where a positive electric potential is subsequently applied to the gate electrode 5 in order to turn the semiconductor device from the shut-off state to a conducting state, a gate electric field reaches the hetero-junction interface where the first hetero semiconductor region 3 and the drain region 2 are in contact with each other through the gate insulating film 4. For this reason, a storage layer in which to store conductivity electrons is formed in parts of the first hetero semiconductor region 3 and parts of the drain region 2, all of which parts are in the vicinity of the gate electrode 5. In other words, potential of the first hetero semiconductor region 3 is reduced in the parts of the junction interface between the hetero semiconductor region 3 and the drain region 2, which parts are in the vicinity of the gate electrode 5. Concurrently, the energy barrier in the drain region 2 becomes abrupt. As a consequence, conductivity electrons can be conducted through the energy barrier.

In this case, the structure according to the first embodiment has a gate voltage, or a threshold voltage, higher than those of the conventional structures. The gate voltage is needed to make a sufficient drive current flow in the parts of the junction interface between the first hetero semiconductor region 3 and the drain region 2, which parts are in the vicinity of the gate electrode 5. However, the switching structure according to the first embodiment is less likely to reduce the drive power. This is because, once the storage layer has been formed in the first hetero semiconductor region 3, the gate electric field extending out from the gate electrode 5 is shielded by the storage layer. This makes a condition which the gate electric field is also less likely to be applied to parts of the drain region 2 in the vicinity of the first hetero semiconductor region 3, which parts are the most susceptible to the drive power. In other words, according to the first embodiment, even if the threshold voltage rises in the gate electrode 5, its consequence is limited to a rise of a voltage constituting the storage layer which is formed in the first hetero semiconductor region 3. The gate electric field which reaches the drain region 2 hardly decreases when an electric current passes through the gate electrode 5. For this reason, the structure according to the first embodiment secures almost the same drive power as the conventional structures do. This is a tendency that an abrupt rise of the energy barrier in the drain region 2 conducts conductivity electrons, which tendency is unique to the switching mechanism possessed by the semiconductor device according to the first embodiment. The semiconductor device according to the first embodiment has characteristics different from those of generally-used MOSFETs which obtain conducting properties by reducing barrier in conducting parts.

The gate electrode 5 is again placed at a ground voltage in order to turn the semiconductor device from the conducting state to the shut-off state. If do so, the storage state of conductivity electrons being stored, which storage state has been formed in the hetero-junction interface between the first hetero semiconductor region 3 and the drain region 2, is released. This release halts the tunneling in the energy barrier. Accordingly, conductivity electrons are stopped from flowing from the first hetero semiconductor region 3 to the drain region 2. Furthermore, once conductivity electrons flow out from the drain region 2 into the substrate 1 so that the drain region 2 is depleted of conductivity electrons, a depletion layer spreads to the drain region 2 so that the semiconductor device is turned into the shut-off state.

In addition, the structure according to the first embodiment can adopt the conductivity in the reverse direction (a reflux operation), which is performed, for example, by grounding the source electrode 6 and by applying a negative potential to the drain electrode 7.

For example, in a case where the source electrode 6 and the gate electrode 5 are placed at the ground potential, if a predetermined positive potential is applied to the drain electrode 7, this dissolves the energy barrier against conductivity electrons. Accordingly, conductivity electrons flow from the drain region 2 to the first hetero semiconductor region 3, and thus the semiconductor device is turned into the reverse conducting state. In this case, the conductivity is achieved by only conductivity electrons, but not by means of hole injection. This reduces loss stemming from a reverse recovery current which occurs when the semiconductor device is turned from the reverse conducting state to the shut-off state. Incidentally, the gate electrode 5 can be used as a control electrode instead of being grounded.

As described above, the semiconductor device according to the first embodiment includes: the semiconductor substrate body of the first conductivity type (the substrate 1 and the drain region 2); the hetero semiconductor region 3 which is in contact with the major surface of the semiconductor body, and which is different in bandgap from the semiconductor substrate body; the gate electrode 5 which is formed in the junction part between the hetero semiconductor region 3 and the semiconductor body with the gate insulating film 4 interposed between the gate electrode 5 and the junction part; the source electrode 6 which is connected with the hetero semiconductor region 3; and the drain electrode 7 which is ohmically connected with the semiconductor substrate body. In the semiconductor device, at least the gate electrode 5 is made of a semiconductor material of second conductivity type. With regard to the conventional semiconductor device, the gate electrode to drive the interface between the $n^-$ polycrystalline silicon and the $n^-$ silicon carbide substrate body has been formed of a metal electrode or $n^-$ polycrystalline silicon. This imposes limitation on inhibition of leakage current which occurs in the hetero-junction interface on the silicon carbide side. In the case of the first embodiment, the gate electrode 5 is formed of $p^-$ polycrystalline silicon. This formation causes built-in potential to deplete the junction interface on both of the polycrystalline silicon side and the silicon carbide side. Accordingly, the semiconductor device has a better shut-off performance when the semiconductor device is placed at the shut-off state, and can reduce leakage current which occurs in parts of the hetero-junction interface, which parts are in the vicinity of the gate electrode. Furthermore, when the semiconductor device is placed at the conducting state, a threshold value rises on the polysilicon side of the junction interface. In response to the rise of the threshold value, electrons are stored there, thus raising voltage which shields the gate electric field. This makes it possible to improve the drive power so that it is higher than ever before.

Moreover, at least impurity concentration of the gate electrode is higher than that of the drain region 2 which is formed on the major surface of the semiconductor substrate body. The larger the difference in impurity concentration between the gate electrode 5 and the drain region 2 is, the larger the width of the depletion layer to spread in the drain region 2 is. As a consequence, if the semiconductor device is configured in this manner, this reduces the leakage current which occurs in the parts of the hetero-junction interface between the drain region 2 and the hetero semiconductor region 3, which parts are in the vicinity of the gate electrode 5. This enables the structure according to the first embodiment to achieve a higher shut-off performance than the conventional structures.

In addition, the semiconductor substrate body is made of silicon carbide. This enables the semiconductor device with high breakdown voltage to be easily realized by use of generally-used semiconductor materials.

Furthermore, the hetero semiconductor region 3 is made of at least one of monocrystalline silicon, polycrystalline silicon and amorphous silicon. This enables the semiconductor device to be easily realized by use of generally-used semiconductor materials.

Figure 4:
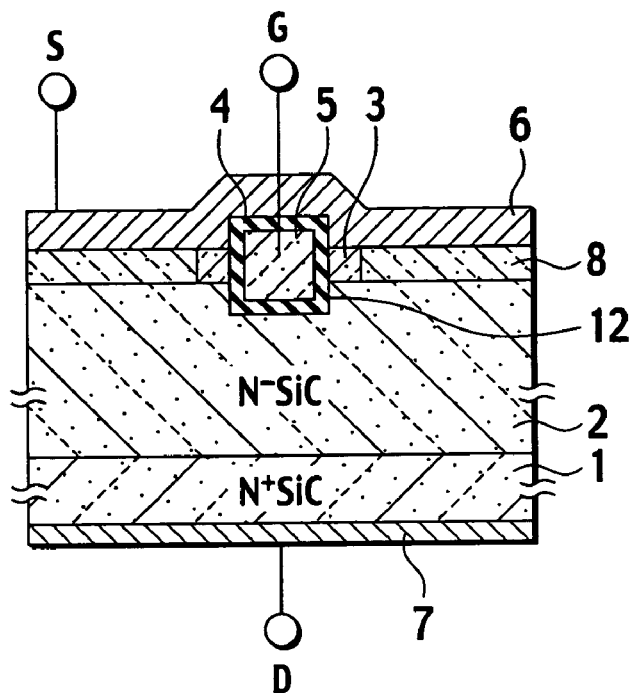
FIG. 4 is a cross-sectional view of a semiconductor device as a third modification of FIG. 1.
Figure 7:
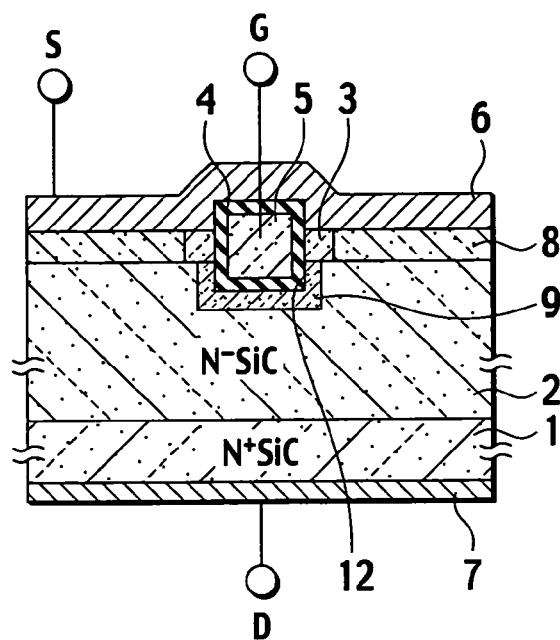
FIG. 7 is a cross-sectional view of a semiconductor device as a fifth modification of FIG. 1.
Figure 8:
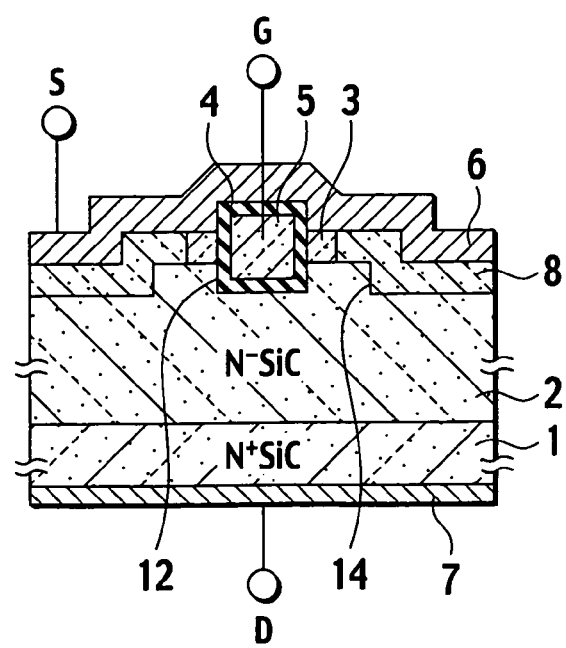
FIG. 8 is a cross-sectional view of a semiconductor device as a sixth modification of FIG. 1.

It should be noted that the present invention can be applied to structures shown in FIGS. 4, 7 and 8, although the present invention has been described giving the example of the structure as shown in FIG. 1

<<Structure shown in FIG. 4>>

What makes the structure shown in FIG. 4 different from the structure shown in FIG. 1 is that the first hetero semiconductor region 3 made, for example, of $n^-$ polycrystalline silicon and a second hetero semiconductor region 8 made, for example, of $p^-$ polycrystalline silicon are formed on the major surface which is opposite to the junction surface between the drain region 2 and the substrate 1. In other words, a junction part where the drain region 2, the first hetero semiconductor region 3 and the second hetero semiconductor region 8 are joined with one another is formed of a hetero-junction between SiC and polycrystalline silicon, whose bandgaps are different from each other. In addition, an energy barrier exists in the junction interface. The gate insulating film 4 made, for example, of a silicon oxide film is formed in a way that a part of the gate insulating film 4 makes an intimate contact with the junction part between the first hetero semiconductor region 3 and the drain region 2. Furthermore, the gate electrode 5 is formed on the gate insulating film 4. The source electrode 6 is formed on the opposing surface, which is opposite to the junction surface between the first hetero semiconductor region 3 and the drain region 2 across the first hetero semiconductor region 3, and which is also opposite to the junction surface between the second hetero semiconductor region 8 and the drain region 2 across the second hetero semiconductor region 8. The drain electrode 7 is formed on the substrate 1 in a way that the drain electrode 7 is connected to the substrate 1.

In accordance with a method of manufacturing the structure as shown in FIG. 4, the $n^-$ first polycrystalline silicon layer is formed in the step of manufacturing the structure as shown in FIG. 1. Thereafter, $p^-$ impurities are introduced into the second hetero semiconductor region 8, which impurities are, for example, of a conductivity type opposite to the $n^-$ conductivity type of the first hetero semiconductor region 3. Otherwise, a $p^-$ polycrystalline silicon layer may be formed, thereafter introducing $n^-$ impurities into the first hetero semiconductor region 3. The conductivity type and impurity concentration of the hetero semiconductor regions can be designed freely in this manner.

Next, descriptions will be provided for operations of this structure. Basically, this structure is almost equal to that as shown in FIG. 1. The semiconductor device with this structure is used, for example, by grounding the source electrode 6 and by applying a positive electric field to the drain electrode 7.

First of all, in a case where the gate electrode 5 is placed, for example, at a ground electric potential or a negative electric potential, the semiconductor device with this structure maintains the shut-off state. This is because an energy barrier against conductivity electrons is formed in the hetero-junction interface between the first hetero semiconductor region 3 and the drain region 2 as well as in the hetero-junction interface between the second hetero semiconductor 8 and the drain region 2. In this case, both the first hetero semiconductor region 3 and the second hetero semiconductor region 8 are made of a silicon material. For this reason, a difference $\Delta Ec$ in energy barrier between the first hetero semiconductor region 3 and the drain region 2 made of silicon carbide is almost equal to a difference $\Delta Ec$ in energy barrier between the second hetero semiconductor region 8 and the drain region 2. However, the $n^-$ first hetero semiconductor region 3 and the $p^-$ second hetero semiconductor region 8 are different from each other in the Fermi energy, when the Fermi energy represents energy from the conductivity band and the Fermi level with regard to each of the $n^-$ first hetero semiconductor region 3 and the $p^-$ second hetero semiconductor region 8. For this reason, the depletion layer extending to the junction interface between the n⁻ first hetero semiconductor region 3 and the drain region 2 as well as the depletion layer extending to the junction interface between the p⁻ second hetero semiconductor region 8 and the drain region 2 are different from each other in width. In other words, the width of the depletion layer extending from the junction interface between the second hetero semiconductor region 8 and the drain region 2 is larger than the width of the depletion layer extending from the junction interface between the first hetero semiconductor region 3 and the drain region 2. Accordingly, this structure can achieve a higher shut-off performance, that is, the leakage current can be reduced. Furthermore, for example, in a case where impurity concentration of the second hetero semiconductor region 8 is set to be higher than that of the first hetero semiconductor region 3, a depletion layer stemming from a built-in electric field of the p-n diode constituted of the second hetero semiconductor region 8 and the first hetero semiconductor region 3 extends towards the first hetero semiconductor region 3. This also makes it possible to reduce the leakage current further more in the hetero-junction part between the first hetero semiconductor region 3 and the drain region 2. In the case of this structure, the hetero semiconductor regions include the second hetero semiconductor region 8, which is formed in a way that the second hetero semiconductor region 8 makes an intimate contact with the drain region 2 formed on the major surface of the semiconductor substrate body, as described above. This inclusion makes it possible to reduce the leakage current further more in the hetero-junction part. In addition, the second hetero semiconductor region 8 is made of at least one of monocrystalline silicon, polycrystalline silicon and amorphous silicon. This makes it possible to easily realize the semiconductor device with this structure by use of generally-used semiconductor materials.

In a case where a positive electric potential is applied to the gate electrode 5 in order to turn the semiconductor device from the shut-off state to the conducting state, the gate electric field reaches the hetero-junction interface where the first hetero semiconductor region 3 is in contact with the drain region 2 with the insulating film 4 interposed between the first hetero semiconductor region 3 and the drain region 2. Accordingly, a storage layer of conductivity electrons is formed in parts of the first hetero semiconductor region 3 and parts of the drain region 2, all of which parts are in the vicinity of the gate electrode 5. In other words, potential is raised up on the side of the first hetero semiconductor region 3 of parts of the junction interface between the first hetero semiconductor region 3 and the drain region 2, which parts are in the vicinity of the gate electrode 5. In addition, the energy barrier becomes abrupt on the side of the drain region 2 of the parts of the junction interface between the first hetero semiconductor region 3 and the drain region 2. This enables conductivity electrons to be conducted through the energy barrier.

The gate electrode 5 is again placed at the ground voltage in order to turn the semiconductor device from the conducting state to the shut-off state. If do so, the storage state of conductivity electrons being stored, which storage state has been formed in the hetero-junction interface between the first hetero semiconductor region 3 and the drain region 2, is released. This release halts the tunneling in the energy barrier. Accordingly, conductivity electrons are stopped from flowing from the first hetero semiconductor region 3 to the drain region 2. Furthermore, once conductivity electrons flow out from the drain region 2 into the substrate 1 so that the drain region 2 is depleted of conductivity electrons, a depletion layer spreads to the drain region 2 from the hetero-junction part so that the semiconductor device is turned into the shut-off state.

In addition, this structure can adopt the conductivity in the reverse direction (a reflux operation), which is performed, for example, by grounding the source electrode 6 and by applying a negative potential to the drain electrode 7, in common with the conventional structures.

For example, in a case where the source electrode 6 and the gate electrode 5 are placed at the ground potential, if a predetermined positive potential is applied to the drain electrode 7, this dissolves the energy barrier against conductivity electrons. Accordingly, conductivity electrons flow from the drain region 2 to the first hetero semiconductor region 3 and the second hetero semiconductor region 8, and thus the semiconductor device is turned into the reverse conducting state. In this case, the conductivity is achieved by only conductivity electrons, but not by means of hole injection. This reduces loss stemming from a reverse recovery current which occurs when the semiconductor device is turned from the reverse conducting state to the shut-off state. Incidentally, the gate electrode 5 can be used as a control electrode instead of being grounded.

<<Fifth Structure>>

Figure 5:
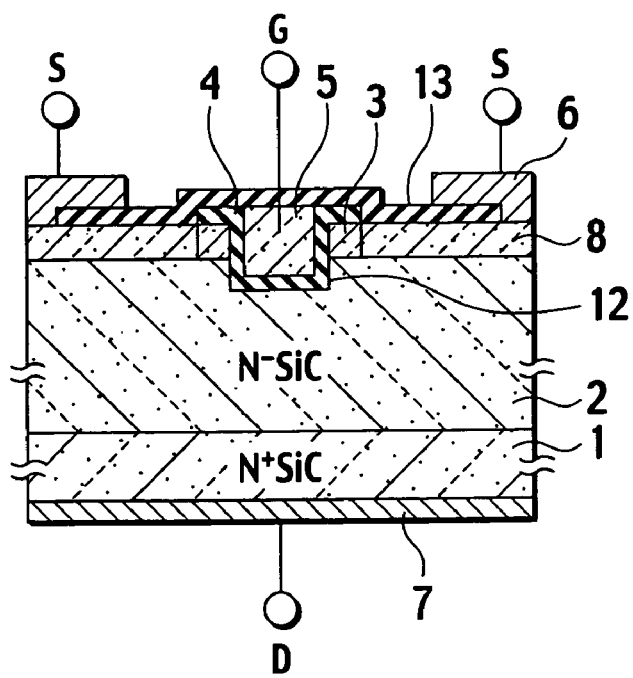
FIG. 5 is a cross-sectional view of a semiconductor device having the second hetero semiconductor region formed of the same material as the gate electrode, as a fourth modification of FIG. 1.

In the case of a structure as shown in FIG. 5, the second hetero semiconductor region 8 is formed of the same material as the gate electrode 5 is formed. Descriptions will be provided for a method of manufacturing this structure with reference to FIGS. 6A and 6E.

Figure 6A:
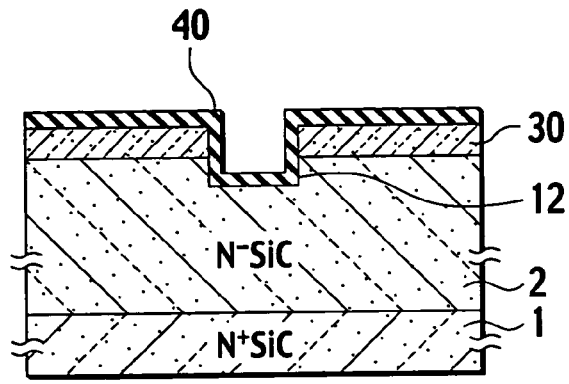
FIG. 6A to 6E are cross-sectional views of the semiconductor device of FIG. 5, showing fabrication processes.

First of all, the n⁻ drain region 2 is epitaxially grown on the n⁺ silicon carbide substrate 1, and thus the n⁻ silicon carbide semiconductor substrate body is formed, as shown in FIG. 6A. Then, a polycrystalline silicon layer is deposited on the n⁻ silicon carbide semiconductor substrate body, for example, by use of a LP-CVD process. Thereafter, the polycrystalline silicon layer is doped with boron, for example, in a $POCl_3$ atmosphere, and thus a first n⁻ polycrystalline silicon layer 30 is formed. Incidentally, the first polycrystalline silicon layer 30 may be formed by depositing polycrystalline silicon on the semiconductor substrate body by an electron beam vapor deposition process or a sputtering process, and by thereafter re-crystallizing the deposited polycrystalline silicon by a laser annealing process. Otherwise, the first polycrystalline silicon layer 30 may be formed of monocrystalline silicon which is hetero-epitaxially grown by a molecular beam epitaxy process or the like. In addition, a combination of an ion implantation process and a thermal activation process to be performed after the ion implantation process may be used for the doping process.

A mask layer (its illustration is omitted) is formed on the first polycrystalline silicon layer 30 by use of a photolithography process and an etching process. Thereafter, the first polycrystalline silicon layer 30 and the surface portion of the drain region 2 are etched through the mask layer, for example, by use of a reactive ion etching (dry etching) process. Thereby, the groove 12 with a predetermined depth is formed. Incidentally, another etching process, such as a wet etching process, may be used as a method of etching the polycrystalline silicon layer.

Subsequently, the gate insulating film 4 is deposited on the top surface of the first hetero semiconductor region 3 and along the inside surface of the groove 12.

Figure 6B:
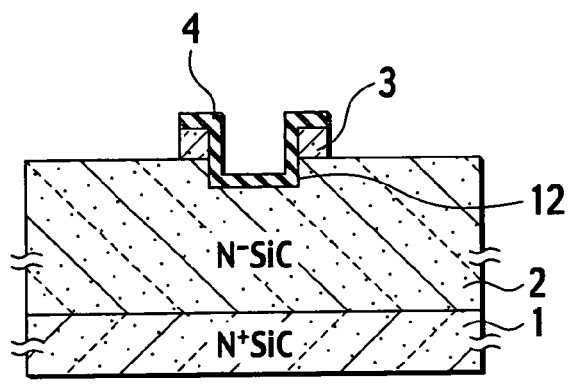

Then, a mask layer (its illustration is omitted) is formed on the gate insulating film 4. The gate insulating film 4 and the polycrystalline silicon layer 30 under the gate insulation film 4 are etched through the mask layer, and thus are fabricated into the state as shown in FIG. 6B. The first hetero semiconductor region 3 is formed in this manner.

Figure 6C:
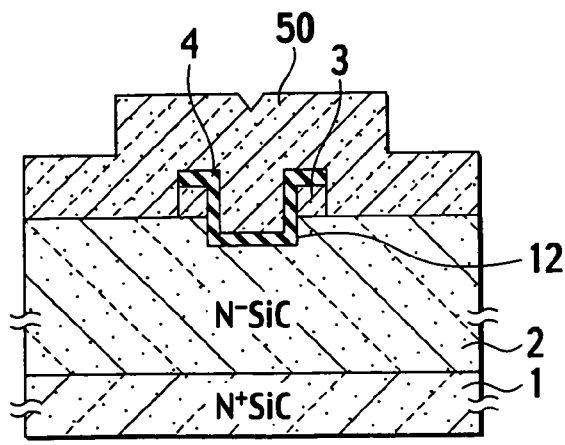

Thence, the mask layer is removed. Thereafter, a polycrystalline silicon layer 50 is deposited on the entire top surface of the semiconductor substrate body, including the gate insulating film 4, as shown in FIG. 6C. The polycrystalline silicon layer 50 will be used later for forming the gate electrode 5 and the second hetero semiconductor region 8 (FIG. 5). Subsequently, boron is added into the polycrystalline silicon layer 50, which will later constitute the gate electrode 5 and the second hetero semiconductor region 8, by use of a solid-phase diffusion process using $BBr_3$. When boron is intended to be added into the polycrystalline silicon layer 50, a combination of an ion implantation process and a thermal activation process to be performed after the ion implantation process may be used for this doping process.

Figure 6D:
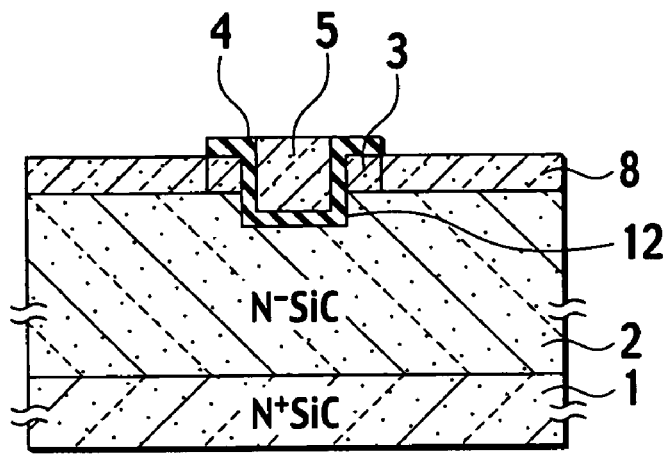

Thereafter, the polycrystalline silicon layer 50 is etched back into a state as shown in FIG. 6D, and thereby the second hetero semiconductor region 8 and the gate electrode 5 are formed simultaneously.

Figure 6E:
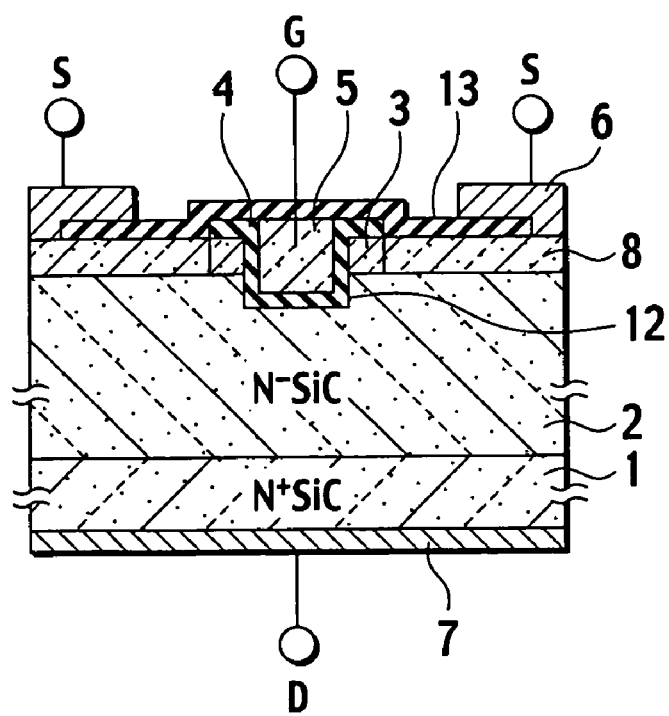

Then, an interlayer dielectric 13 made, for example, of an oxidized film is deposited on the etched-back polycrystalline silicon layer 50 and the gate electrode 5, as shown in FIG. 6E. Then, parts of the interlayer dielectric 13 are removed by use of a photolithography process and an etching process. Thus, a contact hole is opened. Finally, the drain electrode 7 made, for example, of titanium (Ti) and nickel (Ni) is formed on the back surface of the substrate 1. Titanium (Ti) and aluminum (Al) are deposited sequentially on the first hetero semiconductor region 3 above the front surface of the substrate body, and thus the source electrode 6 is formed. The silicon carbide semiconductor device with a structure as shown in FIG. 5 is completed in this manner.

In the case of the semiconductor device with this structure, the second hetero semiconductor region 8 is made of the same material as the gate electrode 6 is formed, as described above. This makes it possible to reduce the leakage current, and concurrently to simplify the manufacturing processes. In addition, in the case of the method of manufacturing the semiconductor device with this structure, the gate electrode 5 is deposited in the same step as the second hetero semiconductor region 8 is deposited. This enables the manufacturing processes to be simplified.

<<Structure Shown in FIG. 7>>

In the case of a structure shown in FIG. 7, an $n^+$ conductivity region 9 whose concentration is higher than that of the drain region 2 is formed in a predetermined part of the drain region 2, with which part the gate insulating film 4 and the first hetero semiconductor region 3 make an intimate contact in addition to the fabrication of the structure as shown in FIG. 4. The conductivity region 9 is also formed in the bottom part of the groove 12 in which the gate electrode 5 is formed. Next, descriptions will be provided for an example of a method of manufacturing a semiconductor device with this structure.

The polycrystalline silicon layer is doped with phosphorus at a higher temperature, for example, in a $POCl_3$ atmosphere while having the mask layer used for forming the groove 12 on itself. Thereby, phosphorus is introduced into the polycrystalline silicon layer through etched parts of the surface of the polycrystalline silicon layer. In addition, phosphorus is introduced into the silicon carbide semiconductor substrate body through etched parts of the surface of the silicon carbide semiconductor substrate body. However, no phosphorus is introduced thereinto through parts covered with the mask layer, as in the case of the structure shown in FIG. 1. For this reason, the first hetero semiconductor region 3 and the $n^+$ conductivity region 9 are simultaneously formed in only a region which is in contact with the ion-etched parts of the surface of the polycrystalline silicon layer. Incidentally, a solid-phase diffusion process may be used for the impurity introduction. Otherwise, a method of introducing impurities, for example, an ion implantation process or the like may be used for the impurity introduction.

If the semiconductor device is configured in this manner, the configuration eases the energy barrier which stems from the hetero-junction between the first hetero semiconductor region 3 and the conductivity region 9. This makes it easy for majority carriers to flow from the first hetero semiconductor region 3 to the drain region 2 through the conductivity region 9. Accordingly, a higher conductivity performance can be obtained, and additionally the on-resistance can be reduced. In accordance with the method of fabricating this structure, the conductivity region 9 can be formed through a self-alignment process with precision, in a way that parts of the conductivity region 9, which parts make an intimate contact with the first hetero semiconductor region 3, are as small in width as necessary, at the same time as the first hetero semiconductor region 3 is formed. This makes it possible to inhibit the current from becoming uneven between the two cells when the semiconductor device is placed in the conducting state and the shut-off state. In addition, this makes it possible to reduce the leakage current in the hetero-junction between the first hetero semiconductor region 3 and the conductivity region 9 as much as possible when the semiconductor device is placed in the shut-off state, accordingly enabling the on-resistance to be reduced without sacrificing the shut-off state to a large extent.

<<Structure Shown in FIG. 8>>

A structure shown in FIG. 8 is obtained through the following process. The groove 14 is formed in the drain region 2, before the polycrystalline silicon layer used for forming the first hetero semiconductor region 3 and the second hetero semiconductor region 8 is formed after the groove 14 is formed, the polycrystalline silicon layer is formed on the drain region. The ensuing steps are the same as those performed for building the structures shown in FIGS. 1 and 4. If the semiconductor device is configured in this manner, this configuration makes it possible for the semiconductor device reduce the leakage current in the first hetero semiconductor region 3 more than the semiconductor device with the structure shown in FIG. 4.

As described above, the various structures as shown in FIGS. 4, 7 and 8 can be build as modifications of the structure shown in FIG. 1.

All of the structures according to the first embodiment have been described giving the example of the semiconductor device, for whose substrate silicon carbide is used as the material. Other semiconductor materials, including silicon, silicon germanium, gallium nitride and diamond, may be used as the material for the substrate. In addition, the descriptions have been provided for all of the structures, giving the example of silicon carbide of the 4H type in terms of polytype. However, silicon carbide of other polytypes, such as of the 6H type and of 3C type, may be used. Furthermore, the descriptions have been provided for all of the structures, giving the example of the transistor with what is termed as the vertical structure, in which the drain electrode 7 and the source electrode 6 are arranged opposite to each other with the drain region 2 interposed between the drain electrode 7 and the source electrode 6, and the drain current is caused to flow in the vertical direction. However, what is termed as the horizontal structure may be used, in which, for example, the drain electrode 7 and the source electrode 6 are arrange in the same single major surface, and the drain current is caused to flow in the horizontal direction.

Moreover, all of the structures have been described, giving the example of use of polycrystalline silicon as the material used for forming the first hetero semiconductor region 3 and the second hetero semiconductor region 8. However, no matter what material may be used as long as the material makes a hetero-junction with silicon carbide. Additionally, the descriptions will be provided for all of the structures, giving the example of use of n$^-$ silicon carbide for the drain region 2, and of use of n$^-$ polycrystalline silicon for the first hetero semiconductor region 3. However, any one of the following combined uses may be applied to all of the structures: combined use of n$^-$ silicon carbide for the drain region 2 and p$^-$ polycrystalline silicon for the first hetero semiconductor region 3; combined use of p$^-$ silicon carbide for the drain region 2 and p$^-$ polycrystalline silicon for the first hetero semiconductor region 3; and combined use of p$^-$ silicon carbide for the drain region 2 and n$^-$ polycrystalline silicon for the first hetero semiconductor region 3.

Second Embodiment

<<Structure>>

Figure 9:
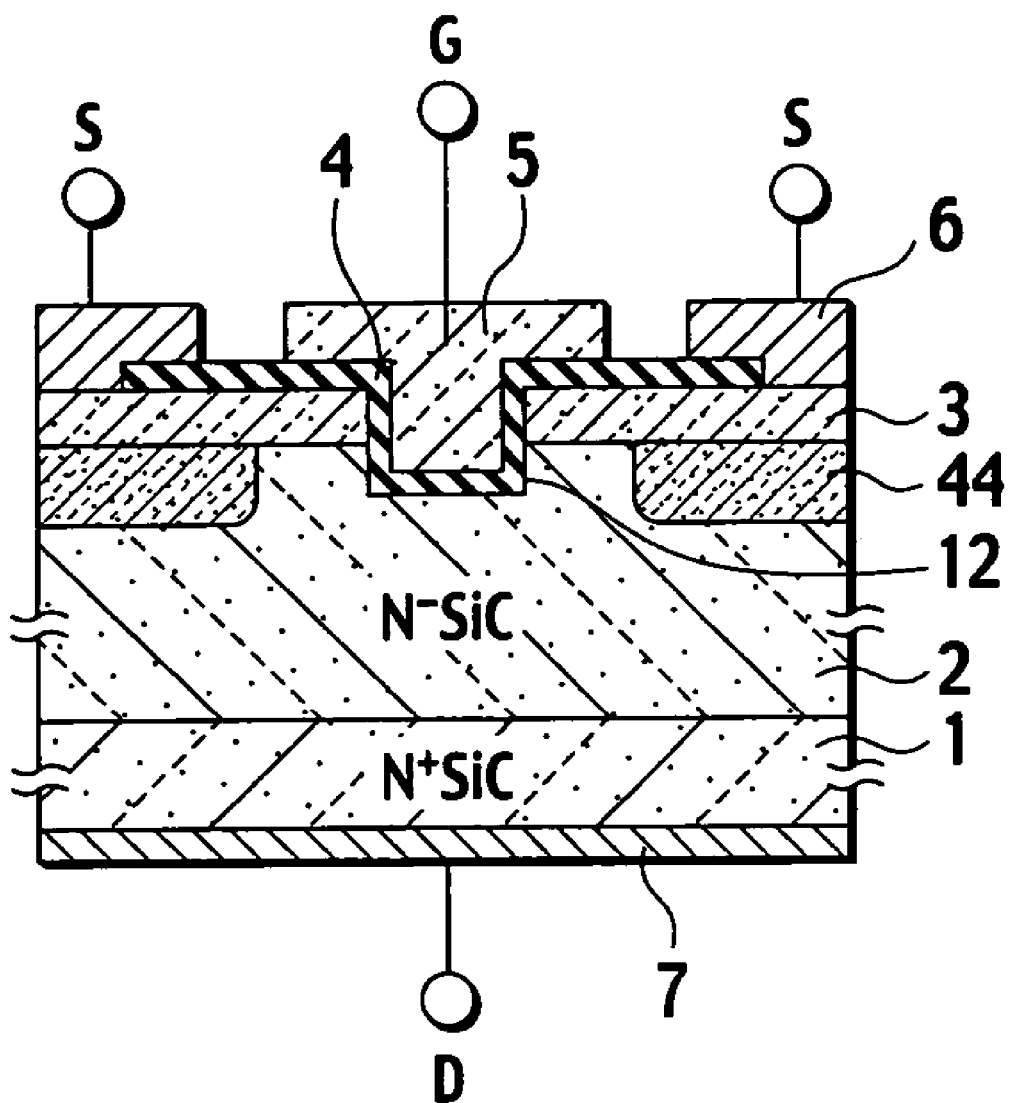
FIG. 9 is a cross-sectional view of a semiconductor device according to the second embodiment of the present invention.

FIG. 9 shows a second embodiment of the semiconductor device according to the present invention. FIG. 1 is a cross-sectional view of the semiconductor device in which two structural unit cells are opposite to each other. This embodiment will be described, giving an example of a semiconductor device, for which substrate silicon carbide (SiC) is used as the material.

A drain region 2 is formed on a silicon carbide substrate 1. The silicon carbide substrate is made, for example, of silicon carbide of the 4H type in terms of polytype, and is of n$^+$ type in terms of conductivity. The drain region is made of n$^-$ silicon carbide epitaxial layer. A first hetero semiconductor region 3 made, for example, of n$^-$ polycrystalline silicon makes an intimate contact with a major surface, which is opposite to a junction surface between the drain region 2 and the substrate 1. In other words, a junction portion where the drain region 2 and the first hetero semiconductor region 3 are joined to each other is formed of a hetero-junction between silicon carbide and polycrystalline silicon, whose bandgaps are different from each other. An energy barrier exists in the junction interface. A p$^+$ well region 44 is formed in the drain region 2 in a way that the p$^+$ well region 44 makes an intimate contact with the first hetero semiconductor region 3. A gate insulating film 4 made, for example, of a silicon oxide film is formed in a way that the gate insulation film 4 makes an intimate contact with a junction surface between the first hetero semiconductor region 3 and the drain region 2. In addition, a gate electrode 5 is formed on the gate insulating film 4. In this case, the well region 44 and the surface of a junction part where the first hetero semiconductor region 3, the drain region 2 and the gate insulating film 4 are joined to one another are arranged in a way that the well region 44 and the surface of the junction part are away from each other with a predetermined distance. In the case of this embodiment, for example, the distance is set to be smaller than a distance with which a built-in depletion layer extends from the end of the junction to the drain region 2 in a case where a predetermined reverse bias voltage as the power supply voltage is applied to a part constituting the pn-junction between the well region 44 and the drain region 2.

It should be noted that a source electrode 6 is on an opposing surface opposite to a junction surface between the first hetero semiconductor region 3 and the drain region 2, and that a drain electrode 7 is formed on the substrate 1 in a way that the drain region 7 makes a connection with the substrate 1.

In addition, in the case of this embodiment, boron is used as impurities added to the p$^+$ well region 44. Boron forms a deep level in the semiconductor substrate body made of silicon carbide. Free carrier concentration at room temperature is characterized as being approximately two orders of magnitude smaller than space charge density in the depletion layer which is formed in the well region 44. It is understood that boron forms an impurity level, in a location of approximately 0.3 eV from the end of the valence band, in the silicon carbide semiconductor substrate body, from a literature (Takemura, O., Kimoto, T., Matsunami, H., Natata, T., Watanabe, M., and Inoue, M. [1998]. *Materials Science Forum,* vols. 264-268, pp. 701-704).

Figure 10:
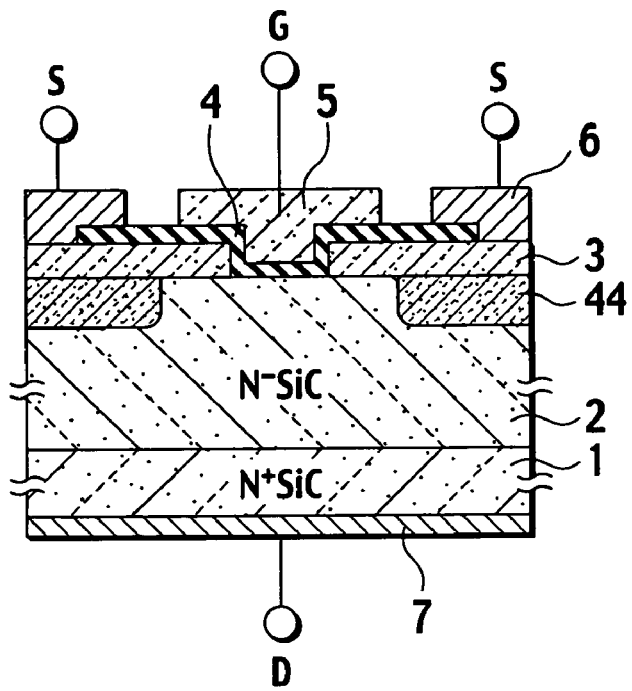
FIG. 10 is a cross-sectional view of a semiconductor device having what is termed as a planar-type structure, as a first modification of FIG. 9.
Figure 11:
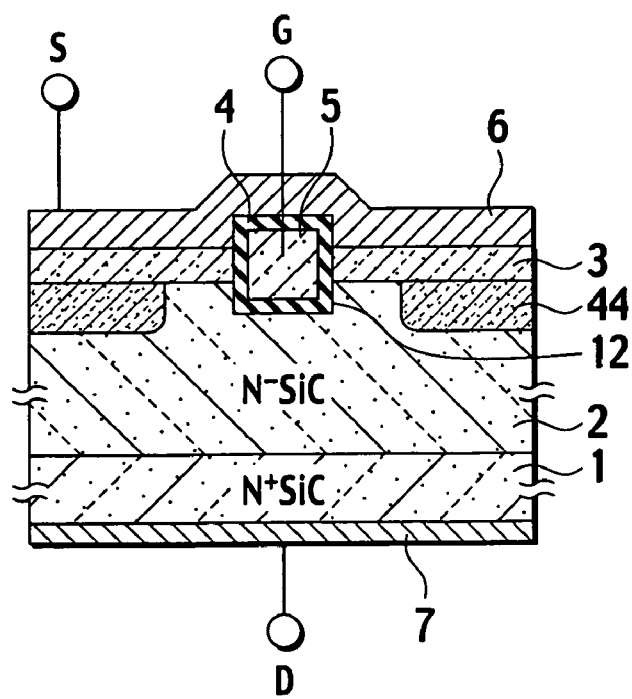
FIG. 11 is a cross-sectional view of a semiconductor device in which the first hetero semiconductor region and the entire surface of the source electrode is in full contact with each other, as a second modification of FIG. 9.

The descriptions have been provided for the semiconductor device according to the second embodiment, giving an example of what is termed as the trench-type structure as shown in FIG. 9. According to the trench-type structure, a groove 12 is formed in a surface portion of the drain region 2, and thereafter the gate electrode 5 is formed in the groove 12 with the gate insulating film 4 interposed between the gate electrode 5 and the inside surface of the groove 12. It should be noted, however, that the semiconductor device may have what is termed as a planar-type structure, according to which no groove is formed in the drain region 2 as shown in FIG. 10. Furthermore, in FIG. 9, a part of the first hetero semiconductor region 3 and a part of the source electrode 6 are in contact with each other through a predetermined contact hole. However, the first hetero semiconductor region 3 and the entire surface of the source electrode 6 may be in full contact with each other, as shown in FIG. 11.

<<Manufacturing Method>>

Next, descriptions will be provided for an example of a method of manufacturing the silicon carbide semiconductor device as shown in FIG. 9 according to the second embodiment of the present invention.

The n$^-$ drain region 2 is epitaxially grown on the n$^+$ silicon carbide substrate 1, and thus an n$^-$ silicon carbide semiconductor substrate body is formed. Then, a mask layer is formed selectively on the n$^-$ silicon carbide semiconductor substrate body through a photolithography process and an etching process. Thereafter, for example, boron impurities are introduced into the n$^-$ silicon carbide semiconductor substrate body through the mask layer. Thence, the region into which the impurities are introduced is annealed, for example, at a temperature of approximately 1,700° C. in order to activate the region into which the impurities are introduced. Through this annealing process, a well region 40 is formed. Then, first polycrystalline silicon is deposited thereon, for example, by use of a LP-CVD process. Afterwards, the first polycrystalline silicon layer is doped with boron, for example, in a POCl$_3$ atmosphere. Thus, an n$^-$ first polycrystalline silicon layer is formed. Incidentally, the first polycrystalline silicon layer may be formed by depositing polycrystalline silicon on the semiconductor substrate body by an electron beam vapor deposition process or a sputtering process, and by thereafter re-crystallizing the deposited polycrystalline silicon by a laser annealing process. Otherwise, the first polycrystalline silicon layer may be formed of monocrystalline silicon which is hetero-epitaxially grown on the semiconductor substrate body by a molecular beam epitaxy process or the like. In addition, a combination of an ion implantation process and a thermal activation process to be performed after the ion implantation process may be used for the doping process.

Thence, a mask layer is formed on the first polycrystalline silicon layer by use of a photolithography process and an etching process. Thereafter, the first polycrystalline silicon layer and the surface portion of the drain region 2 are etched through the mask layer, for example, by use of a reactive ion etching (dry etching) process. Thereby, the groove 12 with a predetermined depth is formed. Incidentally, another etching process, such as a wet etching process, may be used as a method of etching the polycrystalline silicon layer.

Subsequently, the gate insulating film 4 is deposited on the top surface of the first hetero semiconductor region 3 and along the inside surface of the groove 12. Then, a polycrystalline silicon layer which will later constitute the gate electrode 5 is deposited on the gate insulating film 4. Thereafter, phosphorus is added into the polycrystalline silicon layer, which will later constitute the gate electrode 5, by use of a solid-phase diffusion process using $POCl_3$. When phosphorus is intended to be added into the polycrystalline silicon layer, a combination of an ion implantation process and a thermal activation process to be performed the ion implantation process may be used for this doping process. Then, the gate electrode 5 is formed by use of a photolithography process and an etching process. Thence, an interlayer dielectric is deposited. Subsequently, parts of the deposited interlayer dielectric and parts of the gate insulating film 4 are removed by use of a photolithography process and an etching process, and thus the contact hole is opened.

Finally, the drain electrode 7 made, for example, of titanium (Ti) and nickel (Ni) is formed on the back surface of the substrate 1. Titanium (Ti) and aluminum (Al) are deposited sequentially on the first hetero semiconductor region 3 which is on the front surface of the semiconductor substrate body, and thereby the source electrode 6 is formed on the first hetero semiconductor region 3. Through these processes, the silicon carbide semiconductor device as shown in FIG. 1 according to the second embodiment of the present invention is completed.

As described above, the semiconductor device according to the second embodiment can be realized easily by use of the conventional manufacturing techniques.

<<Operations>>

Next, descriptions will be provided for operations of the silicon carbide semiconductor device. In the case of this embodiment, the silicon carbide semiconductor device is used, for example, by grounding the source electrode 6 and by applying a positive electric potential to the drain electrode 7.

First of all, in a case where the gate electrode 5 is placed at a ground electric potential or a negative electric potential, a shut-off state is maintained. This is because an energy barrier against conductivity electrons is formed in the hetero-junction interface between the first hetero semiconductor region 3 and the drain region 2. In the case where the energy barrier is formed, a reverse bias is applied to a part constituting the pn-junction between the well region 44 and the drain region 2 in accordance with the embodiment. If, however, space charge density in a depletion layer extending to the well region 44 is designed to be approximately one order of magnitude, or approximately more than two orders of magnitude, larger than space charge density in a depletion layer extending to the drain region 2, this make it possible to inhibit the depletion region extending to the well region 44. For this reason, the drain electric field hardly reaches the junction interface between the first hetero semiconductor region 3 and the well region 44. In other words, almost no leakage current occurs in the junction interface between the first hetero semiconductor region 3 and the well region 44. In addition, as described above, the semiconductor device according to the second embodiment has the configuration, according to which the depletion layer extending from the junction interface between the drain region and the well region 44 stemming from the drain electric field spreads to parts of the junction interface between the first hetero semiconductor region 3 and the drain region 2, which parts are in the vicinity of the gate electrode 5. This configuration makes it possible for the structure according to the second embodiment to achieve a higher shut-off performance than the conventional structures.

In a case where a positive electric potential is subsequently applied to the gate electrode 5 in order to turn the semiconductor device from the shut-off state to a conducting state, a gate electric field is applied to the hetero-junction interface, where the first hetero semiconductor region 3 and the drain region 2 are in contact with each other, through the gate insulating film 4. For this reason, a storage layer in which to store conductivity electrons is formed in parts of the first hetero semiconductor region 3 and parts of the drain region 3, all of which parts are in the vicinity of the gate electrode 5. In other words, potential of the first hetero semiconductor region 3 is reduced in the parts of the junction interface between the hetero semiconductor region 3 and the drain region 2, which parts are in the vicinity of the gate electrode 5. Concurrently, the energy barrier in the drain region 2 becomes abrupt. As a consequence, conductivity electrons can be conducted through the energy barrier.

In this case, the p-well region 44 is formed of boron, which forms a deep level in the semiconductor substrate body made of silicon carbide in accordance with the second embodiment. In accordance with the structure of the second embodiment, a distance with which a built-in depletion layer extends from the well region 44 to the drain region 2 is short in comparison with the conventional structures. This inhibits a built-in electric field from the well region 44, thus enabling a higher drive power to be obtained. This is because, at room temperature, free carrier concentration of the well region 44 made of boron is approximately two orders of magnitude smaller than space charge density in the depletion layer formed in the well region 44. If, therefore, the condition of reverse bias between the well region 44 and the drain region 2 is released almost fully, the built-in depletion layer comes to have a characteristic, according to which the distance of the extension of the built-in depletion layer is determined virtually by the free carrier concentration in the junction interface between the well region 44 and the drain region 2. In other words, a ratio of the extension of the depletion layer to the well region 44 over the extension of the depletion layer to the drain region 2 varies depending on the free carrier concentration. Accordingly, in accordance with the structure of the second embodiment, the depletion layer is less likely to extend to the drain region 2 in comparison with the conventional structures.

In a case where the well region is arranged near parts of the junction interface between the first hetero semiconductor region and the drain region, which parts are in the vicinity of the gate electrode, for the purpose of improving the shut-off performance in the conventional structures, the gate electric field is shielded off by the built-in electric field spreading from the well region when the semiconductor device is placed at the conducting state. This imposes a limit on improvement of the drive power. By contrast to this, how the built-in electric field spreads from the well region 44 when the semiconductor device is placed at the shut-off state is different from how the built-in electric field spreads from the well region 44 when the semiconductor device is placed at the conducting state in the case of the second embodiment. For this reason, even if the semiconductor device is placed at the conducting state, the shield of the gate electric field can be relaxed. This makes it possible to obtain a higher drive power.

Here, detailed descriptions will be additionally provided for effects of the second embodiment.

First of all, detailed descriptions will be provided for the space charge density and the free carrier concentration in the depletion layer in the impurity region which is formed by use pf the impurity level forming the deep level.

Now, let NA denote the space charge density in the depletion layer formed in the well region 44. The free carrier concentration NA– in the well region 44 at room temperature is expressed by $$NA-=NA(1+g \cdot \exp(q(EA-EFp)/kT))-1 \quad (1)$$

where EFp denotes the Fermi level in the well region 44, EA denotes the impurity level in the well region 44, g denotes the degeneracy factor, and g =4 when the well region is p⁻. k is a Boltzmann constant, and T is a Kelvin temperature.

In a case where the well region 44 is formed of boron, which forms the deep level (a location of approximately 0.3 eV from the end of the valence band) in the semiconductor substrate body made of silicon carbide, if, for example, the space charge density at room temperature is NA=$5 \times 10^{17}$ cm⁻³, the free carrier concentration at room temperature is NA–=$6 \times 10^{15}$ cm⁻³ in accordance with Expression (1). This means that the free carrier concentration NA– is approximately two orders of magnitude smaller than the space charge density NA.

A result of an experience which our group actually carried out showed that, in the case where space charge density in a depletion layer in a p-region formed of boron in a silicon carbide semiconductor substrate body was approximately $5 \times 10^{17}$ cm⁻³, free carrier concentration was approximately $2 \times 10^{15}$ cm⁻³ when the free carrier concentration was found by use of a hall-effect measuring method.

It is clearly understood, from the calculation and the experiment, that, if an impurity region is formed by use of impurities, which forms a deep impurity level, in this manner, free carrier concentration in the impurity region is far smaller than space charge density in a depletion layer. It is also clearly understood, from the calculation and the experiment, that the free carrier concentration can be made approximately two orders of magnitude smaller than the space charge density, in particular if the impurity region is formed of boron in a silicon carbide semiconductor device. In addition, application of this phenomenon improves a trade-off between the leakage current and the drive power in the semiconductor device according to the second embodiment.

The gate electrode 5 is again placed at a ground potential in order to turn the semiconductor device from the conducting state to the shut-off state. If do so, the storage state of conductivity electrons being stored, which storage state has been formed in the hetero-junction interface between the first hetero semiconductor region 3 and the drain region 2, is released. This release halts the tunneling in the energy barrier. Accordingly, conductivity electrons are stopped from flowing from the first hetero semiconductor region 3 to the drain region 2. Furthermore, once conductivity electrons flow out from the drain region 2 into the substrate 1 so that the drain region 2 is depleted of conductivity electrons, a depletion layer spreads from the hetero-junction part to the drain region 2 so that the semiconductor device is turned into the shut-off state.

In addition, the structure according to the second embodiment can adopt the conductivity in the reverse direction (a reflux operation), which is performed, for example, by grounding the source electrode 6 and by applying a negative potential to the drain electrode 7.

For example, in a case where the source electrode 6 and the gate electrode 5 are placed at the ground potential, if a predetermined positive potential is applied to the drain electrode 7, this dissolves the energy barrier against conductivity electrons. Accordingly, conductivity electrons flow from the drain region 2 to the first hetero semiconductor region 3, and thus the semiconductor device is turned into the reverse conducting state. In this case, the conductivity is achieved by only conductivity electrons, but not by means of hole injection. This reduces loss stemming from a reverse recovery current which occurs when the semiconductor device is turned from the reverse conducting state to the shut-off state. Furthermore, even if electric current density is increased when the semiconductor device is placed in the reverse conducting state so that the well region 44 and the drain region 2 are put under a condition of forward bias, the carrier density of the well region 44 is small in comparison with the conventional structures. This inhibits injection of minority carries. In other words, in a case where the semiconductor device is used with a higher current density, too, this reduces loss which stems from a reverse recovery current when the semiconductor device is turned from the reverse conducting state to the shut-off state. Incidentally, the gate electrode 5 can be used as a control electrode without being grounded.

As described above, the semiconductor device according to the second embodiment includes: the semiconductor substrate body of the first conductivity type (the substrate 1 and the drain region 2); the hetero semiconductor region 3 which is in contact with the major surface of the semiconductor body, and which is different in bandgap from the semiconductor substrate body; the gate electrode 5 which is formed in the junction part between the hetero semiconductor region 3 and the semiconductor substrate body with the gate insulating film 4 interposed between the gate electrode 5 and the semiconductor substrate body; the source electrode 6 which is connected with the hetero semiconductor region 3; and the drain electrode 7 which is ohmically connected with the semiconductor substrate body. This semiconductor device includes the well region 44 of second conductivity type in a part of the semiconductor substrate body (the drain region 2) which is away, with a predetermined distance, from the region where at least the hetero semiconductor region 3, the semiconductor substrate body and the gate insulating film 4 are in contact with one another. Accordingly, this semiconductor device has a configuration in which the free carrier concentration in the well region 44 in a case where no depletion layer is formed in the well region 44 is smaller than the space charge density in a depletion layer in a case where the depletion layer is formed in the well region 44. In the case of the conventional structures, if the well region is formed in a way that the well region reaches the vicinity of the channel region for the purpose of securing the breakdown voltage, the built-in electric field influences the drive power when the semiconductor device is placed in the conducting state. Accordingly the breakdown voltage and the drive power are traded off with each other. In the case of the second embodiment, the well region 44 is formed of a material having space charge density and carrier concentration which are different from each other to a large extent, for example boron or the like. The well region 44 maintains the shut-off performance in accordance with a concentration which is determined virtually only by the space charge density, when the semiconductor device is placed in a shut-off state which makes the drain voltage high. When the semiconductor device is placed in a shut-off state which makes the drain voltage low, the built-in electric field extends in the well region 44 in accordance with a concentration which is determined virtually only by the carrier density. This makes the built-in depletion layer small in comparison with a case where the well region 44 is formed, for example, of aluminum. Accordingly, the drive power is improved. In addition, when the semiconductor device is placed in a reverse conducting state, the well region 44 also has a concentration which is determined virtually only by the carrier concentration. This raises the resistance in the well region 44, accordingly enabling holes to be inhibited from being injected from the well region 44. As a consequence, this makes it possible to provide a high-breakdown-voltage field effect transistor with the following characteristics. This high-breakdown-voltage field effect transistor can reduce the leakage current which occurs in the parts of the hetero-junction interface, which parts are in the vicinity of the gate electrode 5, while the semiconductor device is placed in the shut-off state. In addition, the high-breakdown voltage field effect transistor can secure as large a drive power as the conventional transistors have, while in the conducting state.

Furthermore, at least the aforementioned distance is smaller than a distance with which the depletion layer extends into the drain region 2, when a predetermined reverse bias is applied to an end portion of the junction part between the well region 44 and the semiconductor substrate body (the drain region 2). This makes it possible to reduce the leakage current further more, accordingly enabling a higher shut-off performance to be achieved.

In addition, the well region 44 is in contact with the hetero semiconductor region 3. This makes it possible to reduce the leakage current further more, accordingly enabling a higher shut-off performance to be achieved.

Moreover, the semiconductor substrate body is made of silicon carbide. This makes it possible to easily realize the high-breakdown-voltage semiconductor device by use of generally-used semiconductor materials.

Additionally, the hetero semiconductor region 3 is made of a least one of monocystalline silicon, polycrystalline silicon and amorphous silicon. This makes it possible to easily realize the semiconductor device by use of generally-used semiconductor materials.

Besides, the well region 44 is formed by introducing thereinto at least one kind of impurities of boron, gallium, indium and thallium. This makes it possible to easily realize the semiconductor device by use of generally-used semiconductor materials.

It should be noted that the present invention can be applied to structures, for example, as shown in FIGS. 12 to 16, although the present invention has been described giving the example of the structure shown in FIG. 9.

Figure 12:
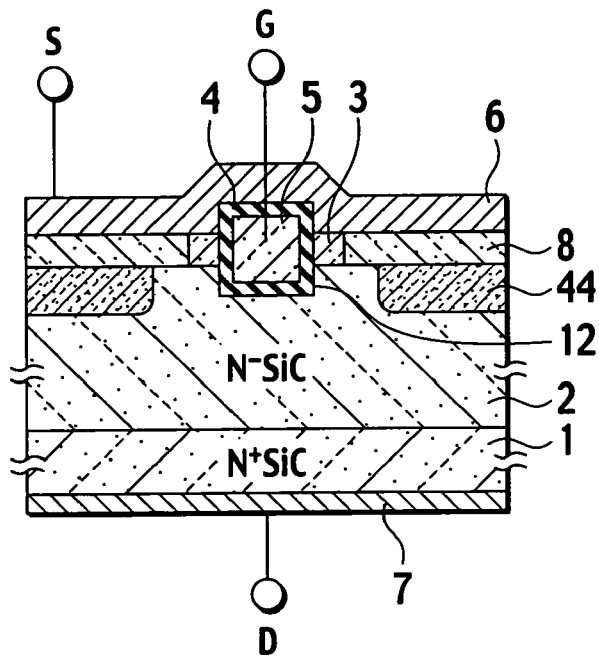
FIG. 12 is a cross-sectional view of a semiconductor device as a third modification of FIG. 9.

<<Structure shown in FIG. 12>>

What makes the structure shown in FIG. 12 different from the structure shown in FIG. 9 is that the first hetero semiconductor region 3 made, for example, of $n^-$ polycrystalline silicon and a second hetero semiconductor region 8 made, for example, of $p^-$ polycrystalline silicon are formed on the major surface which is opposite to the junction surface between the drain region 2 and the substrate 1. In other words, the hetero semiconductor regions are formed with two or more impurity conductivity types, or with two or more impurity concentrations. A junction part where the drain region 2, the first hetero semiconductor region 3 and the second hetero semiconductor region 8 are joined with one another is formed of a hetero-junction between SiC and polycrystalline silicon, whose bandgaps are different from each other. In addition, an energy barrier exists in the junction interface. The gate insulating film 4 made, for example, of a silicon oxide film is formed in a way that a part of the gate insulating film 4 makes an intimate contact with the junction part between the first hetero semiconductor region 3 and the drain region 2. Furthermore, the gate electrode 5 is formed on the gate insulating film 4. The source electrode 6 is formed on the opposing surface, which is opposite to the junction surface between the first hetero semiconductor region 3 and the drain region 2 across the first hetero semiconductor region 3, and which is also opposite to the junction surface between the second hetero semiconductor region 8 and the drain region 2 across the second hetero semiconductor region 8. The drain electrode 7 is formed on the substrate 1 in a way that the drain electrode 7 is connected to the substrate 1.

In accordance with a method of manufacturing the structure as shown in FIG. 12, the $n^-$ first polycrystalline silicon layer is formed in the step of manufacturing the structure as shown in FIG. 9. Thereafter, $p^-$ impurities are introduced into the second hetero semiconductor region 8, which impurities are, for example, of a conductivity type opposite to the $n^-$ conductivity type of the first hetero semiconductor region 3. Otherwise, a $p^-$ polycrystalline silicon layer may be formed, thereafter introducing $n^-$ impurities into the first hetero semiconductor region 3. The conductivity type and impurity concentration of the hetero semiconductor regions can be designed freely in this manner.

Descriptions will be provided for operations of this structure. Basically, this structure is almost equal to that as shown in FIG. 9. The semiconductor device with this structure is used, for example, by grounding the source electrode 6 and by applying a positive electric potential to the drain electrode 7.

First of all, in a case where the gate electrode 5 is placed, for example, at a ground electric potential or a negative electric potential, the semiconductor device with this structure maintains the shut-off state. This is because an energy barrier against conductivity electrons is formed in the hetero-junction interface between the first hetero semiconductor region 3 and the drain region 2 as well as in the hetero-junction interface between the second hetero semiconductor 8 and the drain region 2. In this case, both the first hetero semiconductor region 3 and the second hetero semiconductor region 8 are made of a silicon material. For this reason, a difference $\Delta Ec$ in energy barrier between the first hetero semiconductor region 3 and the drain region 2 made of silicon carbide is almost equal to a difference $\Delta Ec$ in energy barrier between the second hetero semiconductor region 8 and the drain region 2. However, the n-first hetero semiconductor region 3 and the p-second hetero semiconductor region 8 are different from each other in the Fermi energy, when the Fermi energy represents energy from the conductivity band and the Fermi level with regard to each of the n-first hetero semiconductor region 3 and the p-second hetero semiconductor region 8. For this reason, the depletion layer extending to the junction interface between the n-first hetero semiconductor region 3 and the drain region 2 as well as the depletion layer extending to the junction interface between the p-second hetero semiconductor region 8 and the drain region 2 are different from each other in width. In other words, the width of the depletion layer extending from the junction interface between the second hetero semiconductor region 8 and the drain region 2 is larger than the width of the depletion layer extending from the junction interface between the first hetero semiconductor region 3 and the drain region 2. Accordingly, this structure can achieve a higher shut-off performance, that is, the leakage current can be reduced. Furthermore, for example, in a case where impurity concentration of the second hetero semiconductor region 8 is set to be higher than that of the first hetero semiconductor region 3, a depletion layer stemming from a built-in electric field of the pn-diode constituted of the second hetero semiconductor region 8 and the first hetero semiconductor region 3 extends towards the first hetero semiconductor region 3. This also makes it possible to reduce the leakage current further more in the hetero-junction part between the first hetero semiconductor region 3 and the drain region 2. In the case of this structure, the hetero semiconductor regions include the second hetero semiconductor region 8, which is formed in a way that the second hetero semiconductor region 8 makes an intimate contact with the drain region 2 formed on the major surface of the semiconductor substrate body, as described above. This inclusion makes it possible to reduce the leakage current further more in the hetero-junction part. In addition, the second hetero semiconductor region 8 is made of at least one of monocrystalline silicon, polycrystalline silicon and amorphous silicon. This makes it possible to easily realize the semiconductor device with this structure by use of generally-used semiconductor materials.

Next, in a case where a positive electric potential is applied to the gate electrode 5 in order to turn the semiconductor device from the shut-off state to the conducting state, the gate electric field reaches the hetero-junction interface where the first hetero semiconductor region 3 is in contact with the drain region 2 with the gate insulating film 4 interposed between the first hetero semiconductor region 3 and the drain region 2. Accordingly, a storage layer of conductivity electrons is formed in parts of the first hetero semiconductor region 3 and parts of the drain region 2, all of which parts are in the vicinity of the gate electrode 5. In other words, potential is reduced on the side of the first hetero semiconductor region 3 of parts of the junction interface between the first hetero semiconductor region 3 and the drain region 2, which parts are in the vicinity of the gate electrode 5. In addition, the energy barrier becomes abrupt on the side of the drain region 2 of the parts of the junction interface between the first hetero semiconductor region 3 and the drain region 2. This enables conductivity electrons to be conducted through the energy barrier.

Next, the gate electrode 5 is again placed at the ground potential in order to turn the semiconductor device from the conducting state to the shut-off state. If do so, the storage state of conductivity electrons being stored, which storage state has been formed in the hetero-junction interface between the first hetero semiconductor region 3 and the drain region 2, is released. This release halts the tunneling in the energy barrier. Accordingly, conductivity electrons are stopped from flowing from the first hetero semiconductor region 3 to the drain region 2. Furthermore, once conductivity electrons flow out from the drain region 2 into the substrate 1 so that the drain region 2 is depleted of conductivity electrons, a depletion layer spreads to the drain region 2 from the hetero-junction part so that the semiconductor device is turned into the shut-off state.

In addition, this structure can adopt the conductivity in the reverse direction (a reflux operation), which is performed, for example, by grounding the source electrode 6 and by applying a negative potential to the drain electrode 7, in common with the conventional structures.

For example, in a case where the source electrode 6 and the gate electrode 5 are placed at the ground potential, if a predetermined positive potential is applied to the drain electrode 7, this dissolves the energy barrier against conductivity electrons. Accordingly, conductivity electrons flow from the drain region 2 to the first hetero semiconductor region 3 and the second hetero semiconductor region 8, and thus the semiconductor device is turned into the reverse conducting state. In this case, the conductivity is achieved by only conductivity electrons, but not by means of hole injection. This reduces loss stemming from a reverse recovery current which occurs when the semiconductor device is turned from the reverse conducting state to the shut-off state. Incidentally, the gate electrode 5 can be used as a control electrode instead of being grounded.

Figure 13:
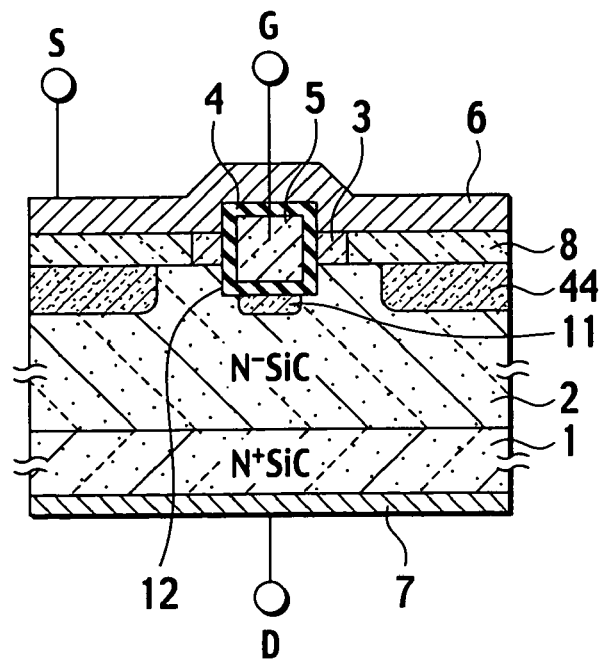
FIG. 13 is a cross-sectional view of a semiconductor device as a fourth modification of FIG. 9.

In the case of a structure shown in FIG. 13, a second well region 11 is formed in a way that the second well 11 makes an intimate contact with the bottom part of the groove 12 in which the gate electrode 5 is formed, in addition to a first well region 44 being formed. In other words, the well region 11 is formed on the gate insulating film 4. While the semiconductor is placed in the shut-off state, a depletion layer in response to the drain potential spreads to parts of the drain region 2, which parts are between the first well region 44 and the second well region 11. In other words, the first well region 44 relaxes the drain electric field, which has been applied to the hetero-junction interface between the first hetero semiconductor region 3 and the drain region 2 as well as the hetero-junction interface between the second hetero semiconductor region 8 and the drain region 2. This reduces the leakage current further more, and improves the shut-off performance further more. Moreover, the second well region 11 relaxes the drain electric field which has been applied to the gate insulating film 4. This makes it possible to make the dielectric less likely to break down in the gate insulating film 4, thus enabling reliability of the gate insulating film 4 to be improved.

Figure 14:
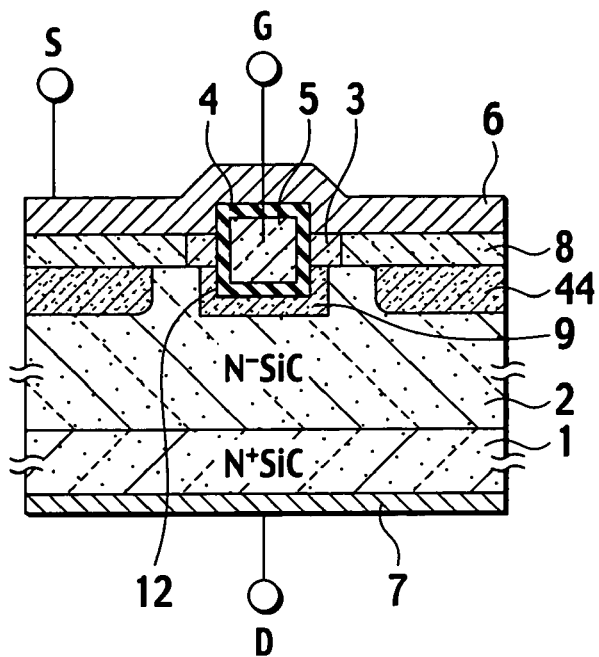
FIG. 14 is a cross-sectional view of a semiconductor device as a fifth modification of FIG. 9.

<<Structure Shown in FIG. 14>>

In the case of a structure shown in FIG. 14, an $n^+$ conductivity region 9 whose concentration is higher than that of the drain region 2 is formed in a predetermined part of the drain region 2, with which part the gate insulating film 4 and the first hetero semiconductor region 3 make an intimate contact, in addition to the fabrication of the structure as shown in FIG. 4. The conductivity region 9 is also formed in the bottom part of the groove 12 in which the gate electrode 5 is formed. Next, descriptions will be provided for an example of a method of manufacturing a semiconductor device with this structure.

The polycrystalline silicon layer is doped with phosphorus at a higher temperature, for example, in a $POCl_3$ atmosphere while having the mask layer used for forming the groove 12 on itself. Thereby, phosphorus is introduced into the polycrystalline silicon layer through etched parts of the surface of the polycrystalline silicon layer. In addition, phosphorus is introduced into the silicon carbide semiconductor substrate body through etched parts of the surface of the silicon carbide semiconductor substrate body. However, no phosphorus is introduced thereinto through parts covered with the mask layer, as in the case of the structure shown in FIG. 9. For this reason, the first hetero semiconductor region 3 and the $n^+$ conductivity region 9 are simultaneously formed in only a region which is in contact with the etched parts of the surface of the polycrystalline silicon layer.

Incidentally, a solid-phase diffusion process may be used for the impurity introduction. Otherwise, a method of introducing impurities, for example, an ion implantation process or the like may be used for the impurity introduction.

If the semiconductor device is configured in this manner, the configuration eases the energy barrier which stems from the hetero-junction between the first hetero semiconductor region 3 and the conductivity region 9. This makes it easy for majority carriers to flow from the first hetero semiconductor region 3 to the drain region 2 through the conductivity region 9. Accordingly, a higher conductivity characteristic can be obtained, and additionally the on-resistance can be reduced. In accordance with the method of fabricating this structure, the conductivity region 9 can be formed through a self-alignment process with precision, in a way that parts of the conductivity region 9, which parts make an intimate contact with the first hetero semiconductor region 3, are as small in width as necessary, at the same time as the first hetero semiconductor region 3 is formed. This makes it possible to inhibit the current from becoming uneven between the two cells when the semiconductor device is placed in the conducting state and the shut-off state. In addition, this makes it possible to reduce the leakage current in the hetero-junction between the first hetero semiconductor region 3 and the conductivity region 9 as much as possible, accordingly enabling the on-resistance to be reduced without sacrificing the shut-off state to a large extent.

Figure 15:
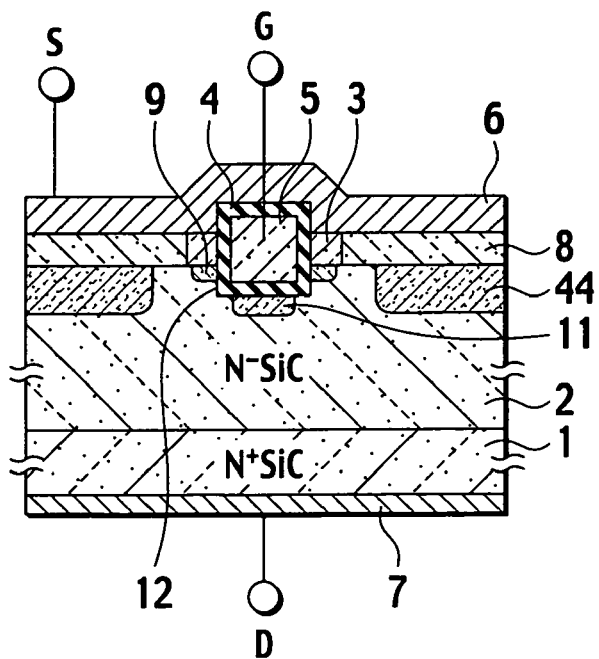
FIG. 15 is a cross-sectional view of a semiconductor device as a sixth modification of FIG. 9.

<<Structure Shown in FIG. 15>>

In the case of the structure shown in FIG. 15, an $n^+$ conductivity region 9 whose concentration is higher than that of the drain region 2 is formed in a predetermined part of the drain region 2, with which part the gate insulating film 4 and the first hetero semiconductor region 3 make an intimate contact. In addition, a first well region 44 is formed in parts of the surface of the drain region 2, which parts are away, with a predetermined distance, from parts where the gate electrode 5 and the first hetero semiconductor region 3 are opposite to each other, in a way that the first well region 44 makes an intimate contact with the first hetero semiconductor region 3 or the second hetero semiconductor region 8. In addition, a second well region 11 is formed in a way that the second well region 11 makes an intimate contact with the bottom part of the groove 12 in which the gate electrode 5 is formed. Descriptions will be provided below for an example of a method of manufacturing the semiconductor device with this structure.

The first well region 44 is formed in the surface of the second drain region 2, for example, before a polycrystalline silicon layer to be used for forming the first hetero semiconductor region 3 and the second hetero semiconductor region 8 is formed on the surface of the drain region 2 (in this case, the second well region 11 may be formed in the surface of the drain region 2 at the same). After the first well region 44 is formed therein, the polycrystalline silicon layer and a mask layer to be used for forming the groove 12 are formed on the surface of the drain region 2. Thereafter, the groove 12 is formed by means of an ion etching process through the mask layer. Subsequently, for example, boron ions are implanted into the surface part of the second drain region 2 while the mask layer being thereon. Thereby, the second well region 11 is formed. Moreover, the polycrystalline silicon layer is doped with phosphorus at a higher temperature, for example, in a $POCl_3$ atmosphere while having the mask layer on itself. Thereby, phosphorus is introduced into the polycrystalline silicon layer through etched parts of the surface of the polycrystalline silicon layer. The $n^-$ first hetero semiconductor region 3 and the $n^+$ conductivity region 9 are simultaneously formed. Incidentally, it dose not matter whether the second well region 11 or a group of the first hetero semiconductor region 3 and the conductivity region 9 are formed first, although this structure has been described giving the case where the formation of the second well region 11 is followed by the formation of the first hetero semiconductor region 3 and the conductivity region 9.

If the semiconductor device is configured in this manner, this configuration eases the energy barrier stemming from the hetero-junction between the first hetero semiconductor region 3 and the conductivity region 9 while the semiconductor device is placed in the conducting state, accordingly enabling a higher conductivity characteristic to be obtained. In other words, this configuration makes the on-resistance further smaller, hence improving the conductivity performance.

In addition, a depletion layer spreads in parts of the drain region 2 between the first well region 44 and the second well region 11 in accordance with the drain electric potential, when the semiconductor device is placed at the shut-off state. In other words, the first well region 44 relaxes the drain electric field which has been applied to the hetero-junction interface between the first hetero semiconductor region 3 and the drain region. 2 and the hetero-junction interface between the second hetero semiconductor region 8 and the drain region 2. This relaxation reduces the leakage current further more, and improves the shut-off performance more. Additionally, the second well region 11 relaxes the drain electric field which has been applied to the gate insulating film 4. This relaxation can make the dielectric less likely to break down in the gate insulation film 4, thus enabling reliability of the gate insulation film 4 to be improved.

It should be noted that at least the first well region 44 may be formed out of the conductivity region 9, the first well region 44 and the second well region 11, although this structure has been described giving the case where all of the three regions are formed.

Figure 16:
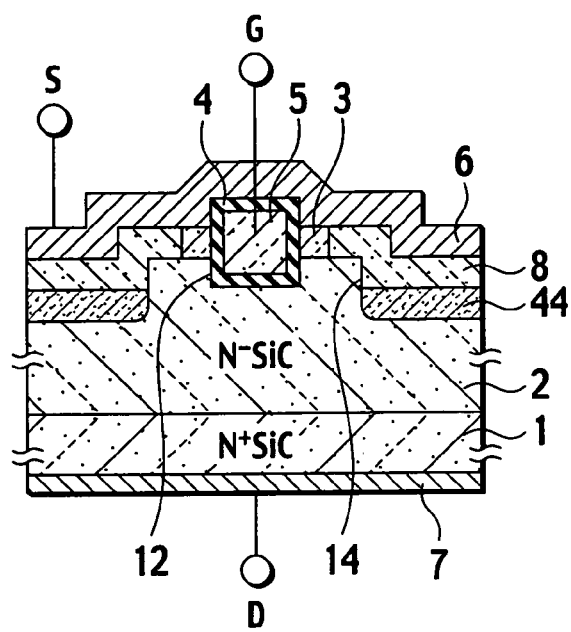
FIG. 16 is a cross-sectional view of a semiconductor device as a seventh modification of FIG. 9.

<<Structure Shown in FIG. 16>>

In the case of a structure shown in FIG. 16, the groove 14 is formed in the drain region 2, before the polycrystalline silicon layer to be used for forming the first hetero semiconductor region 3 and the second hetero semiconductor region 9 is formed on the drain region 2. After the groove 14 is formed in the drain region2, the polycrystalline silicon layer is formed on the drain region 2. The ensuing steps are the same as those to be performed in the case where the structures shown in FIGS. 9 and 12 are built. The semiconductor device thus configured makes it possible to reduce the leakage current in the first hetero semiconductor region 3 more than the semiconductor device with the structure as shown in FIG. 12.

As described above, the structures shown in FIGS. 12 to 16 can be built as modifications of the structure shown in FIG. 9.

All of the structures according to this embodiment have been described giving the example of the semiconductor device, for whose substrate silicon carbide is used as the material. However, other semiconductor materials, including silicon, silicon germanium, gallium nitride and diamond, may be used as the material for the substrate. In addition, the descriptions have been provided for all of the structures, giving the example of silicon carbide of the 4H type in terms of polytype. However, silicon carbide of other polytypes, such as of the 6H type and of the 3C type, may be used. Furthermore, the descriptions have been provided for all of the structures, giving the example of the transistor with what is termed as the vertical structure, in which the drain electrode 7 and the source electrode 6 are arranged opposite to each other with the drain region 2 interposed between the drain electrode 7 and the source electrode 6, and the drain current is caused to flow in the vertical direction. However, the transistor with what is termed as the horizontal structure may be used, in which, for example, the drain electrode 7 and the source electrode 6 are arrange in the same single major surface, and the drain current is caused to flow in the horizontal direction.

Moreover, the descriptions have been provided for all of the structures, giving the example of use of polycrystalline silicon as the material used for forming the first hetero semiconductor region 3 and the second hetero semiconductor region 8. However, no matter what material may be used as long as the material makes a hetero-junction with silicon carbide. Additionally, the descriptions have been provided for all of the structures, giving the example of use of n⁻ silicon carbide for the drain region 2, and of use of n⁻ polycrystalline silicon for the first hetero semiconductor region 3. However, any one of the following combined uses may be applied to all of the structures: combined use of n⁻ silicon carbide for the drain region 2 and p⁻ polycrystalline silicon for the first hetero semiconductor region 3; combined use of p⁻ silicon carbide for the drain region 2 and p⁻ polycrystalline silicon for the first hetero semiconductor region 3; and combined use of p⁻ silicon carbide for the drain region 2 and n⁻ polycrystalline silicon for the first hetero semiconductor region 3.

Third Embodiment

Figure 17:
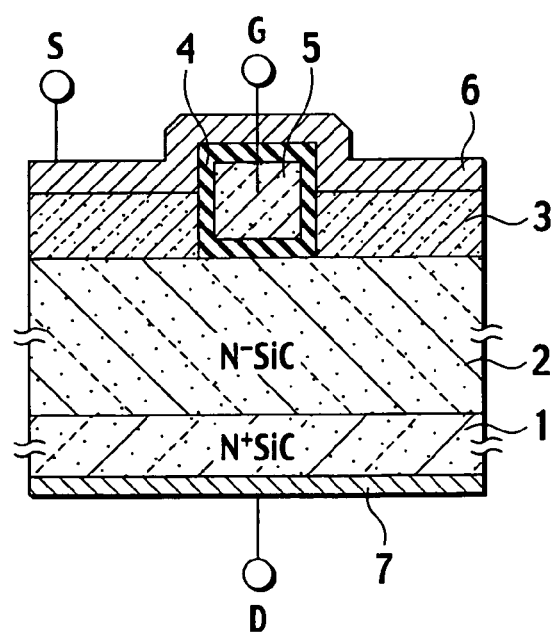
FIG. 17 is a cross-sectional view of a semiconductor device according to the third embodiment of the present invention.

<<Structure Shown in FIG. 17>>

FIG. 17 shows a third embodiment of the semiconductor device according to the present invention. FIG. 17 is a cross-sectional view of the semiconductor device in which two structural unit cells are opposite to each other. This embodiment will be described, giving an example of a semiconductor device whose substrate material is silicon carbide (SiC).

A drain region 2 is formed on a silicon carbide substrate 1. The silicon carbide substrate is made, for example, of silicon carbide of the 4H type in terms of polytype, and is of n⁺ type in terms of conductivity. The drain region is made of n⁻ silicon carbide epitaxial layer. A hetero semiconductor region 3 made, for example, of n⁻ polycrystalline silicon is formed in a way that the hetero semiconductor 3 makes an intimate contact with a main substrate, which is opposite to a junction surface between the drain region 2 and the substrate 1. In other words, a junction part where the drain region 2 and the hetero semiconductor region 3 are joined to each other is formed of a hetero-junction between silicon carbide and polycrystalline silicon, whose bandgaps are different from each other. An energy barrier exists in the junction interface. A gate insulating film 4 made, for example, of a silicon oxide film is formed in a way that a part of the gate insulating film 4 makes an intimate contact with the junction part between the hetero semiconductor region 3 and the drain region 2. In addition, a gate electrode 5 is formed on the gate insulating film 4. A source electrode 6 is formed on an opposing surface opposite to the junction surface between the hetero semiconductor region 3 and the drain region 2. A drain electrode 7 is formed on the substrate 1 in a way that the drain electrode is connected to the substrate 1.

The descriptions have been provided for the semiconductor device according to the third embodiment, giving an example of what is termed as the planar-type structure as shown in FIG. 17. According to the planar-type structure, almost none of the surface portion of the drain region 2 is dug. It should be noted, however, that the semiconductor device may have what is termed as a trench-type structure, according to which a groove is formed in the drain region 2, and thus a gate electrode is embedded into the groove.

<<Manufacturing Method>>

Next, descriptions will be provided for an example of a method of manufacturing the silicon carbide semiconductor device as shown in FIG. 17 according to the third embodiment of the present invention with reference to FIGS. 18A to 18F.

Figure 18A:
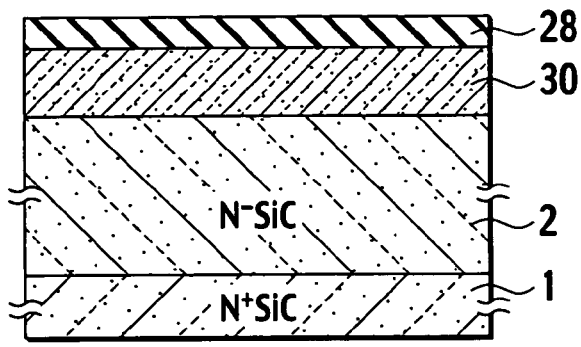
FIGS. 18A to 18F are cross-sectional views of the semiconductor device of FIG. 17, showing fabrication processes.

As shown in FIG. 18A, first of all, the n⁻ drain region 2 is epitaxially grown on the n⁺ silicon carbide substrate 1, and thus an n⁻ silicon carbide semiconductor substrate body is formed. Then, a first polycrystalline silicon layer is deposited on the n⁻ silicon carbide semiconductor substrate body, for example, by use of a LP-CVD process. Thereafter, the first polycrystalline silicon layer is doped with phosphorus, for example, in a POCl₃ atmosphere, and thus an n⁻ polycrystalline silicon layer 30 is formed. Incidentally, the first polycrystalline silicon layer may be formed by depositing polycrystalline silicon on the semiconductor substrate body by an electron beam vapor deposition process, a sputtering process or the like, and by thereafter re-crystallizing the deposited polycrystalline silicon by a laser annealing process or the like. Otherwise, the first polycrystalline silicon layer may be formed of monocrystalline silicon which is hetero-epitaxially grown on the semiconductor substrate body, for example, by a molecular beam epitaxy process or the like. In addition, a combination of an ion implantation process and a thermal activation process to be performed after the ion implantation process may be used for the doping process. For example, the impurity concentration and the thickness of the drain region 2 are $1 \times 10^{16} \text{cm}^{-3}$ and 10 µm respectively. For example, the first polycrystalline silicon layer 30 is 0.5 µm in thickness.

Additionally, in the case of the third embodiment, an oxidation inhibiting film 28 made of a silicon nitride film is deposited on the polycrystalline silicon layer 30, for example, by use of a LP-CVD process or the like. As described below, if this silicon nitride film is formed, this formation makes it possible to oxidize parts of the polycrystalline silicon layer 30 selectively. This brings about an additional effect which makes it possible to form a more fully homogeneous hetero semiconductor region 3 (FIG. 17). Incidentally, the silicon nitride film does not have to be formed. In addition, it does not matter at all that the silicon nitride layer is formed above the polycrystalline silicon layer 30 with another film such as a oxidized film interposed between the silicon nitride layer and the polycrystalline silicon layer 30, although the third embodiment is described giving an example of a case where the silicon nitride film is formed directly on the polycrystalline silicon layer 30. Moreover, no matter what other material may be used as a material for the oxidation inhibiting layer 28 as long as the material can be at least oxidized selectively and is easy to remove, although the third embodiment is described giving an example of use of the silicon nitride film as an material for the oxidation inhibiting film 28.

Figure 18B:
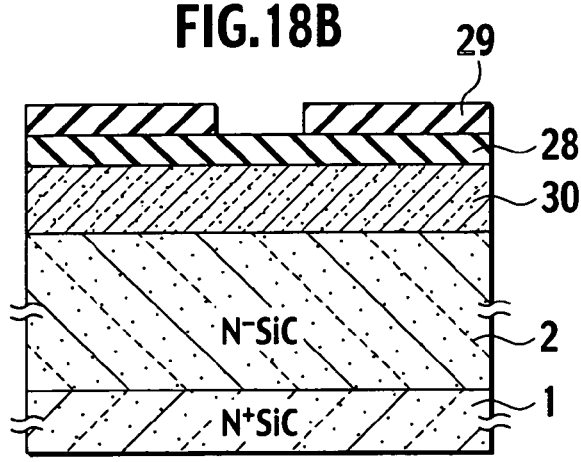

Then, a mask layer 29 having predetermined openings is formed on the oxidation inhibiting film 28 by use of a photolithography process and an etching process, as shown in FIG. 18B.

Figure 18C:
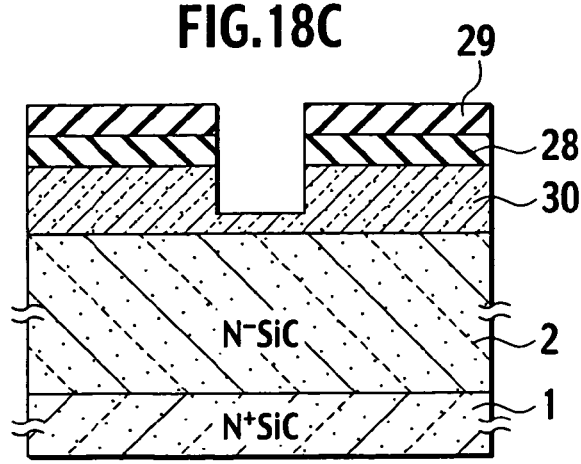

Subsequently, the oxidation inhibiting film 28 made of the silicon nitride film and the surface portion of the polycrystalline silicon layer 30 are etched, for example, by use of a reactive ion etching process (a dry etching process), as shown in FIG. 18C. In this process, the polycrystalline silicon layer 30 is etched in a way that the polycrystalline silicon layer 30 remains to be not etched with a predetermined thickness. There is no restriction imposed on the method of etching the polycrystalline silicon layer 30. If, however, an anisotropic etching technique is used for the etching method, this improves the patterning precision.

In this case, it is desirable that the predetermined thickness, with which the polycrystalline silicon layer 30 remains to be not etched, be larger than a thickness with which an influence of this etching process reaches the polycrystalline silicon layer 30, lest etching damage to be introduced into the polycrystalline silicon layer 30 by the dry etching process should reach the drain region 2 at minimum.

In addition, it does not matter at all that the oxidation inhibiting film 28 and the polycrystalline silicon layer 30 are etched separately from each other, although this embodiment is described giving an example of the method of the manufacturing method which enables the manufacturing processes to be simplified by sequentially etching the oxidation inhibiting film 28 made of the silicon nitride film and the polycrystalline silicon layer 30 by use of the similar processes while the oxidation inhibiting film 28 made of the silicon nitride film and the polycrystalline silicon layer 30 have the mask layer 29 on themselves.

Figure 18D:
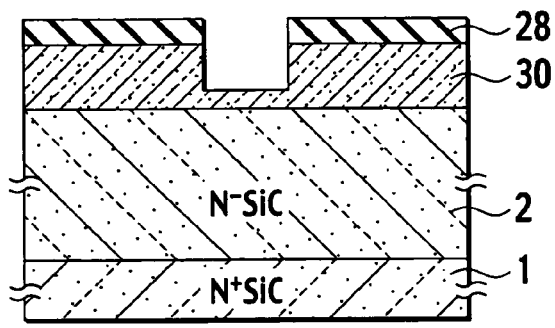
Figure 18E:
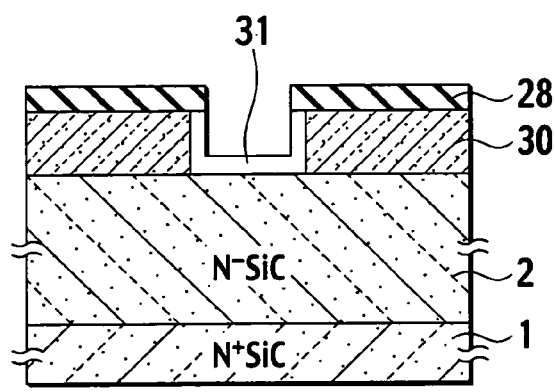

Thence, the mask layer 29 is removed, as shown in FIG. 18D.

Thereafter, parts of the polycrystalline silicon layer 30, which parts are not coated with the silicon nitride film constituting the oxidation inhibiting film 28, are thermally oxidized, and thus the oxidized film 31 is formed. At this time, the thermal oxidation process is performed, for example, at a temperature of 1,000° C. in an atmosphere of premixed combustion of $H_2O$ and $O_2$, and a mixture ratio of $H_2O$ to $O_2$ is 3:7. Here, the manufacturing method is described giving the example of use of what is termed as a wet oxidation process. However, another technique, such as a dry thermal oxidation technique, a pyrogenic oxidation technique and a stream oxidation technique, may be used for the oxidation process.

Furthermore, in the case of the third embodiment, parts of the surface portion of the drain region 2 are oxidized at the same time as this oxidation process is performed. This brings about an effect which reduces a level of the hetero-junction interface with which the gate insulating film is in contact in the ensuing steps.

Figure 18F:
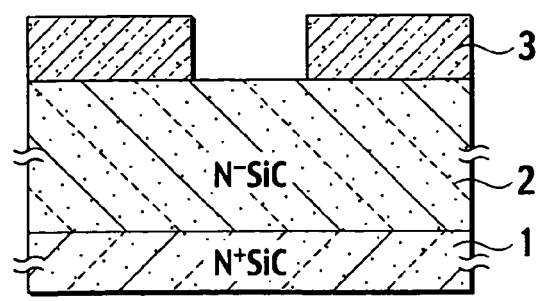

Next, as shown in FIG. 18F, the silicon nitride film constituting the oxidation inhibiting film 28 is removed, for example, by use of a phosphoric acid solution. Thereafter, the oxidized film 31 which has been formed is removed, for example, by use of a mixed solution of hydrofluoric acid and ammonium fluoride, and thus the hetero semiconductor region 3 is formed.

Afterwards, as shown in FIG. 17, the gate insulating film 4 is deposited along the inside surface of a groove constituted of a part of the top surface of the drain region 2 and the side wall of the corresponding etched part of the hetero semiconductor region 3. Then, a polycrystalline silicon layer which will later constitute the gate electrode 5 is deposited on the gate insulating film 4. Thereafter, phosphorus is added into the polycrystalline silicon layer, which will later constitute the gate electrode 5, by use of a solid-phase diffusion process using $POCl_3$. Then, the gate electrode 5 is formed by use of a photolithography process and an etching process. Thence, the gate insulating film 4 is again deposited in a way that this gate insulating film 4 caps the upper portion of the gate electrode 5. Subsequently, parts of the gate insulating film 4 which has been formed on the top surface of the hetero semiconductor region 3 are removed by use of a photolithography process and an etching process, and a the contact hole is opened. The third embodiment has been described giving the example of the case where the gate insulating film 4 remains only around the gate electrode 5. However, the gate insulating film 4 may be formed in a way that the gate insulation film 4 remains on parts of the top surface of the hetero semiconductor region 3.

Finally, the drain electrode 7 made, for example, of titanium (Ti) and nickel (Ni) is formed on the back surface of the substrate 1. Titanium (Ti) and aluminum (Al) are deposited sequentially on the front surface of the first hetero semiconductor region 3 which is on the front surface of the substrate 1, and thereby the source electrode 6 is formed on the first hetero semiconductor region 3. Through these processes, the silicon carbide semiconductor device as shown in FIG. 17 according to the third embodiment of the present invention is completed.

As described above, the semiconductor device according to the third embodiment includes: the semiconductor substrate body of the first conductivity type (the substrate 1 and the drain region 2); the hetero semiconductor region 3 which is in contact with the major surface of the semiconductor substrate body, and which is different in bandgap from the semiconductor substrate body; the gate electrode 5 which is formed in the junction part between the hetero semiconductor region 3 and the semiconductor substrate body with the gate insulating film 4 interposed between the gate electrode 5 and the junction part; the source electrode 6 which is connected with the hetero semiconductor region 3; and the drain electrode 7 which is ohmically connected with the semiconductor substrate body. A method of manufacturing this semiconductor device is configured to include at least: a first step of forming the hetero semiconductor layer 30 on at least the major surface of the semiconductor substrate body; a second step of etching the hetero semiconductor layer 30 selectively by use of the mask layer 9 having the predetermined openings in a way that the mask layer 9 remains to be not etched with the predetermine thickness; a third step of oxidizing exposed parts of the hetero semiconductor layer 30; a fourth step of forming the hetero semiconductor region 3 by etching the oxidized film 31 which has been formed through the oxidation process; and a fifth step of forming the gate insulating film 4 in a way that the gate insulating film 4 makes an intimate contact with the hetero semiconductor region 3 and the semiconductor substrate body.

As a consequence, the method of manufacturing the semiconductor device according to the third embodiment makes it possible to easily realize the semiconductor device by use of the conventional manufacturing techniques. In addition, if this manufacturing method is adopted, this makes it possible to pattern the hetero semiconductor region 3 without introducing damages thereinto. Concurrently, this makes it possible to lower the level in the junction interface between the hetero semiconductor region 3 and the drain region 2. Accordingly, the drive power is improved when switching operations are performed. Incidentally, conventional manufacturing methods have caused a patterned part of the hetero semiconductor region 3 to regress with a width equivalent to the thickness of the polycrystalline silicon layer in the case where the pattering is performed by use of a thermal oxidation process and an etching process. This restricts the patterned part of the hetero semiconductor region 3 in a finer scale, and deforms the cross-sectional shape of the patterned part of the hetero semiconductor region 3. In the case of the third embodiment, the hetero semiconductor layer 30 is patterned by sequential use of the etching process and the oxidation process. This makes it possible to fabricate the patterned part of the hetero semiconductor region 3 in a finer scale without adding to the manufacturing steps, and makes it possible to fabricate the patterned part of the hetero semiconductor region 3 with its cross-sectional shape similar to that which the hetero semiconductor region 3 would be dry-etched. Accordingly, reliability is less likely to be reduced.

In addition, the aforementioned thickness is set to be larger than a thickness with which an influence of this etching process reaches the hetero semiconductor layer 30, when at least the etching process in the second step is performed. This makes it possible to prevent the influence of the etching process from introducing damages into the hetero semiconductor layer 30, and concurrently makes it possible to reduce the level in the junction interface between the hetero semiconductor layer 30 and the drain region 2. Accordingly, the drive power can be improved when the semiconductor device is placed in the conducting state.

Furthermore, parts of the semiconductor substrate body which are in contact with the hetero semiconductor layer 30 are oxidized at the same time as the exposed parts of the hetero semiconductor layer 30 is oxidized in the oxidation process in the third step. This simultaneous oxidation makes it possible to reduce the level in the hetero-junction interface, with which the gate insulating film 4 makes an intimate contact, in the ensuing steps.

Additionally, the oxidation process to be performed in the third step is a thermal oxidation process. This makes it possible to easily form the oxidized film 31.

Moreover, the oxidation inhibiting film 28 is formed on the hetero semiconductor layer between the first step and the second step. This makes it possible to oxidize parts of the polycrystalline silicon layer 30 selectively. This makes it possible to form the more homogeneous hetero semiconductor region 3.

Over and above that, the oxidation inhibiting film 28 and the hetero semiconductor layer 30 are sequentially etched while the oxidation inhibiting film 28 and the hetero semiconductor layer 30 have the mask layer 29 thereon. This makes it possible to simplify the manufacturing processes.

As well, the semiconductor substrate body is made of silicon carbide. This makes it possible to easily realize the semiconductor device with a higher breakdown voltage by use of generally-used semiconductor materials.

Over and above that, the hetero semiconductor region 3 is made of at least one of monocrystalline silicon, polycrystalline silicon and amorphous silicon. This makes it possible to easily realize the semiconductor device by use of generally-used semiconductor materials.

<<Operations>>

Next, descriptions will be provided for operations of the silicon carbide semiconductor device. In the case of the third embodiment, the silicon carbide semiconductor device is used, for example, by grounding the source electrode 6 and by applying a positive electric potential to the drain electrode 7.

First of all, in a case where the gate electrode 5 is placed, for example, at a ground electric potential or a negative electric potential, a shut-off state is maintained. This is because an energy barrier against conductivity electrons is formed in the hetero-junction interface between the hetero semiconductor region 3 and the drain region 2.

Then, in a case where a positive electric potential is subsequently applied to the gate electrode 5 in order to turn the semiconductor device from the shut-off state to a conducting state, a gate electric field reaches the hetero-junction interface, where the hetero semiconductor region 3 and the drain region 2 are in contact with each other, through the gate insulating film 4. For this reason, a storage layer in which to store conductivity electrons is formed in parts of the hetero semiconductor region 3 and parts of the drain region 2, all of which parts are in the vicinity of the gate electrode 5. In other words, potential of the hetero semiconductor region 3 is reduced in the parts of the junction interface between the hetero semiconductor region 3 and the drain region 2, which parts are in the vicinity of the gate electrode 5. Concurrently, the energy barrier in the drain region 2 becomes abrupt. As a consequence, conductivity electrons can be conducted through the energy barrier.

Next, the gate electrode 5 is again placed at a ground potential in order to turn the semiconductor device from the conducting state to the shut-off state. If do so, the storage state of conductivity electrons being stored, which storage state has been formed in the hetero-junction interface between the hetero semiconductor region 3 and the drain region 2, is released. This release halts the tunneling in the energy barrier. Accordingly, conductivity electrons are stopped from flowing from the hetero semiconductor region 3 to the drain region 2. Furthermore, once conductivity electrons flow out from the drain region 2 into the substrate 1 so that the drain region 2 is depleted of conductivity electrons, a depletion layer spreads to the drain region 2 from the hetero-junction part so that the semiconductor device is turned into the shut-off state.

In addition, this structure can adopt the conductivity in the reverse direction (a reflux operation), which is performed, for example, by grounding the source electrode 6 and by applying a negative potential to the drain electrode 7.

In a case where the source electrode 6 and the gate electrode 5 are placed, for example, at the ground potential, if a predetermined positive potential is applied to the drain electrode 7, this dissolves the energy barrier against conductivity electrons. Accordingly, conductivity electrons flow from the drain region 2 to the hetero semiconductor region 3, and thus the semiconductor device is turned into the reverse conducting state. In this case, the conductivity is achieved by only the conductivity electrons, but not by means of hole injection. This reduces loss stemming from a reverse recovery current which occurs when the semiconductor device is turned from the reverse conducting state to the shut-off state. Incidentally, the gate electrode 5 can be used as a control electrode without being grounded.

It should be noted that the present invention can be applied to structures as shown, for example, in FIGS. 19 to 22, although the manufacturing method has been described giving the example of the structure shown in FIG. 17.

Figure 19:
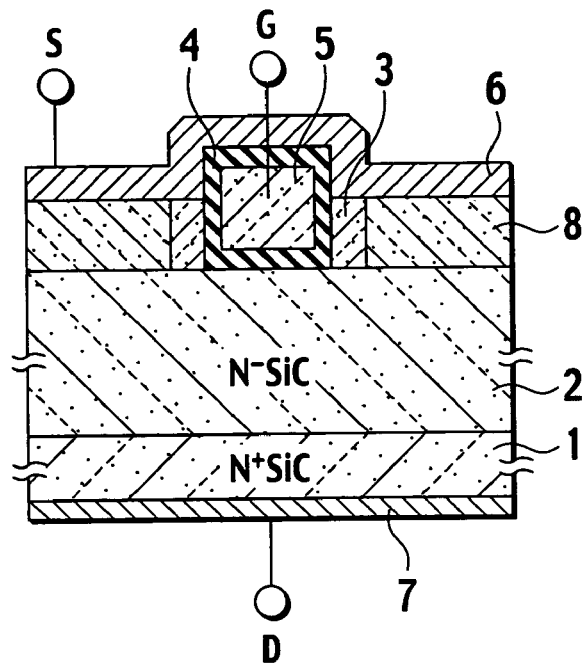
FIG. 19 is a cross-sectional view of a semiconductor device as a first modification of FIG. 17.

<<Structure shown in FIG. 19>>

What makes the structure shown in FIG. 19 different from the structure shown in FIG. 17 is that the hetero semiconductor region 3 made, for example, of n⁻ polycrystalline silicon and a second hetero semiconductor region 8 made, for example, of p⁻ polycrystalline silicon are formed on the major surface which is opposite to the junction surface between the drain region 2 and the substrate 1. In other words, a junction part where the drain region 2, the hetero semiconductor region 3 and the second hetero semiconductor region 8 are joined with one another is formed of a hetero-junction between SiC and polycrystalline silicon, whose bandgaps are different from each other. In addition, an energy barrier exists in the junction interface. The gate insulating film 4 made, for example, of a silicon oxide film is formed in a way that a part of the gate insulating film 4 makes an intimate contact with the junction part between the hetero semiconductor region 3 and the drain region 2. Furthermore, the gate electrode 5 is formed on the gate insulating film 4. The source electrode 6 is formed on the opposing surface, which is opposite to the junction surface between the hetero semiconductor region 3 and the drain region 2 across the first hetero semiconductor region 3, and which is also opposite to the junction surface between the second hetero semiconductor region 8 and the drain region 2 across the second hetero semiconductor region 8. The drain electrode 7 is formed on the substrate 1 in a way that the drain electrode 7 is connected to the substrate 1.

In accordance with a method of manufacturing the structure as shown in FIG. 19, p⁻ impurities are introduced into a predetermined part of the hetero semiconductor region 3 (the second hetero semiconductor region 8), which impurities are, for example, of a conductivity type opposite to the n-conductivity type of the hetero semiconductor region 3, after the fourth step of forming the hetero semiconductor region 3 by etching the oxidized film 31. In this manner, the method of fabricating the structure as shown in FIG. 19 allows the conductivity types and the impurity concentrations respectively of the hetero semiconductor regions to be freely designed.

Next, descriptions will be provided for operations of this structure. Basically, this structure is almost equal to that as shown in FIG. 17. Such a configuration improves the shut-off performance further more. This is because an energy barrier against conductivity electrons is formed in the hetero-junction interface between the hetero semiconductor region 3 and the drain region 2 as well as in the hetero-junction interface between the second hetero semiconductor 8 and the drain region 2. In this case, both the hetero semiconductor region 3 and the second hetero semiconductor region 8 are made of a silicon material. For this reason, a difference ΔEc in energy barrier between the hetero semiconductor region 3 and the drain region 2 made of silicon carbide is almost equal to a difference ΔEc in energy barrier between the second hetero semiconductor region 8 and the drain region 2. However, the n⁻ hetero semiconductor region 3 and the p⁻ second hetero semiconductor region 8 are different from each other in the Fermi energy, when the Fermi energy represents energy from the conductivity band and the Fermi level with regard to each of the n⁻ first hetero semiconductor region 3 and the p⁻ second hetero semiconductor region 8. For this reason, the depletion layer extending to the junction interface between the n⁻ first hetero semiconductor region 3 and the drain region 2 as well as the depletion layer extending to the junction interface between the p⁻ second hetero semiconductor region 8 and the drain region 2 are different from each other in width. In other words, the width of the depletion layer extending from the junction interface between the second hetero semiconductor region 8 and the drain region 2 is larger than the width of the depletion layer extending from the junction interface between the hetero semiconductor region 3 and the drain region 2. Accordingly, this structure can achieve a higher shut-off performance, that is, the leakage current can be reduced. Moreover, for example, in a case where impurity concentration of the second hetero semiconductor region 8 is set to be larger than that of the hetero semiconductor region 3, a depletion layer stemming from the built-in electric field of the pn-diode constituted of the second hetero semiconductor region 8 and the hetero semiconductor region 3 extends to the hetero semiconductor region 3. This also makes it possible to reduce the leakage current further more in the hetero-junction part between the hetero semiconductor region 3 and the drain region.

Figure 20:
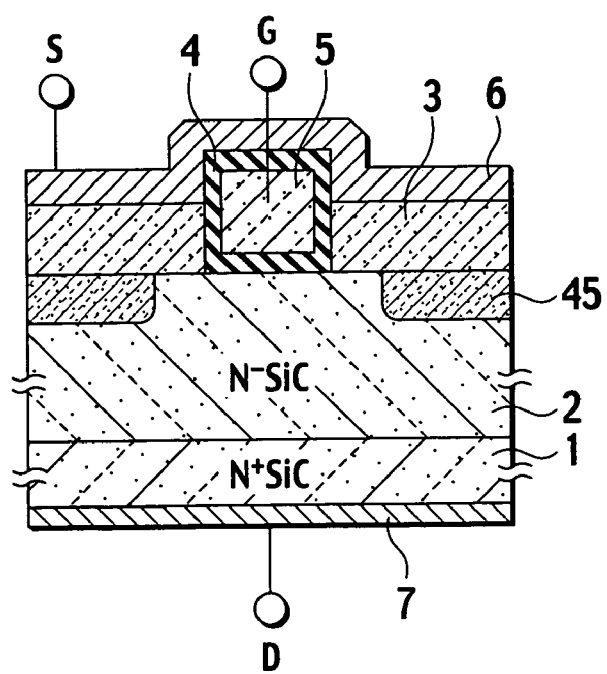
FIG. 20 is a cross-sectional view of a semiconductor device as a second modification of FIG. 17.

<<Structure Shown in FIG. 20>>

A structure shown in FIG. 20 includes an electric field relaxation region 45 in addition to the structure shown in FIG. 17. The electric field relaxation region 45 is formed in parts of the surface of the drain region 2, which parts are away, with a predetermined distance, from parts where the gate electrode 5 and the hetero semiconductor region 3 are opposite to each other, in a way that the electric field relaxation region 45 makes an intimate contact with the hetero semiconductor region 3. Descriptions will be provided below for an example of a method of manufacturing a semiconductor device with the structure shown in FIG. 20.

In the step shown in FIG. 18A for fabricating the structure shown in FIG. 17, aluminum ions or boron ions are implanted into parts of the drain region 2 while the drain region 2 is masked with a mask layer, for example, before the hetero semiconductor layer 30 is formed. Thus, the p⁻ electric field relaxation region 45 is formed. Incidentally, the p⁻ electric field relaxation region 45 may be formed by use of a solid-phase diffusion process. The ensuing steps are the same as those to be performed for fabricating the structure shown in FIG. 17.

Such a configuration causes a depletion layer to spread between the electric field relaxation region 45 and the drain region 2 in accordance with the drain electric potential, while the semiconductor device is placed at the shut-off state. In other words, the electric field relaxation region 45 relaxes the drain electric field which has been applied to the hetero-junction interface between the hetero semiconductor region 3 and the drain region 2. This reduces the leakage current further more, and accordingly the shut-off performance is improved more.

Figure 21:
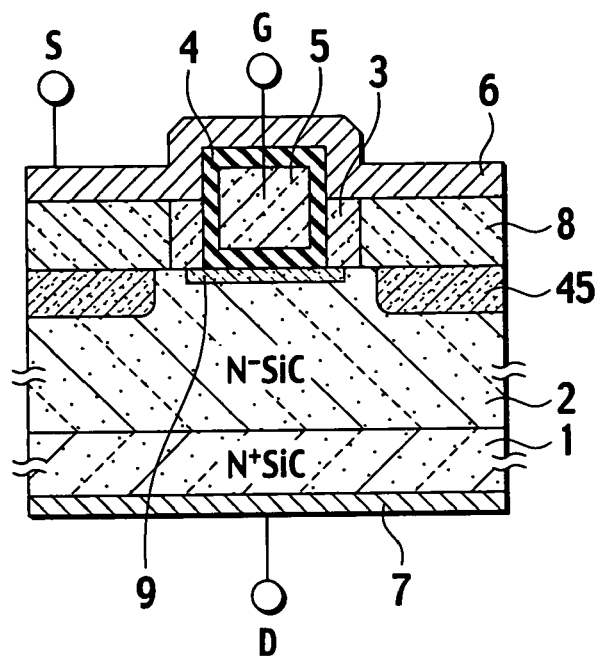
FIG. 21 is a cross-sectional view of a semiconductor device as a third modification of FIG. 17.

<<Structure Shown in FIG. 21>>

A structure shown in FIG. 21 includes an n⁺ conductivity region 9, whose concentration is higher than that of the drain region 2, in addition to the structures shown in FIGS. 19 and 20. The n⁺ conductivity region 9 is formed in a predetermined part of the drain region 2, in which part the gate insulating film 4 and the hetero semiconductor region 3 are in contact with each other. Descriptions will be provided below for an example of a method of fabricating the structure shown in FIG. 21.

The semiconductor substrate body is doped with phosphorus, for example, in a POCl₃ atmosphere at a higher temperature, for example, while the hetero semiconductor layer 30 has the oxidation inhibiting film 28 on itself (see FIG. 18E), after the oxidized film 10 is removed. If do so, phosphorus is introduced into parts of the surface of the silicon carbide semiconductor substrate body, and thus the n⁺ conductivity region 9 is formed therein. Incidentally, the impurities may be introduced by use of a solid-phase diffusion process. Otherwise, a method of introducing impurities, such as an ion implantation technique, may be used for the impurities introduction.

Such a configuration makes it easy for majority carriers to flow from the hetero semiconductor region 3 to the drain region 2 through the conductivity region 9. This makes it possible to obtain a characteristic of higher conductivity, and accordingly enabling the on-resistance to be reduced.

Figure 22:
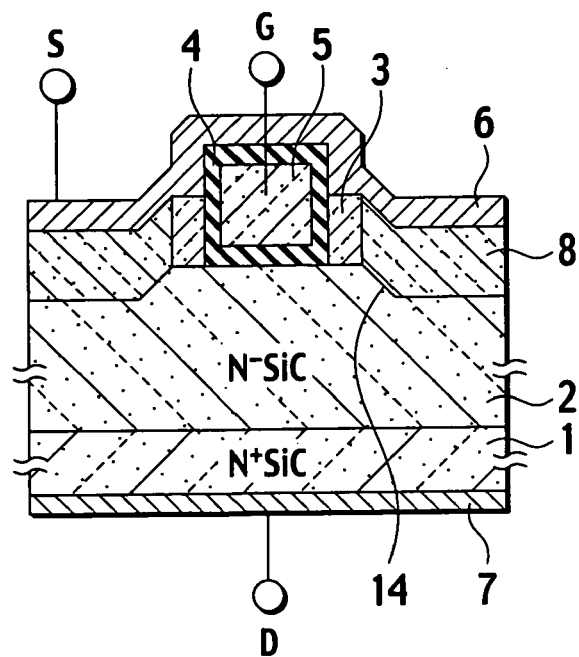
FIG. 22 is a cross-sectional view of a semiconductor device as a fourth modification of FIG. 17.

<<Structure Shown in FIG. 22>>

A structure shown in FIG. 22 is a modification of the structure shown in FIG. 19. A groove 14 is formed in the drain region 2 before a hetero semiconductor layer 30 made of polycrystalline silicon is formed as shown in FIG. 18A. After the groove 14 is formed in the drain region 2, the hetero semiconductor layer 30 is formed. The ensuing steps are the same as those to be performed for fabricating shown in FIG. 17. Such a configuration makes it possible for the structure shown in FIG. 22 to reduce the leakage current in the hetero semiconductor region 3 more than the structure shown in FIG. 17.

The various structures as shown in FIGS. 19 to 22 can be fabricated by use of the basic processes of the present invention shown in FIGS. 18A to 18F.

All of the structures according to the third embodiment have been described giving the example of the semiconductor device, for whose substrate silicon carbide is used as the material. However, any other semiconductor material, such as silicon, silicon germanium, gallium nitride and diamond, may be used as the material for the substrate. In addition, the descriptions have been provided for all of the structures, giving the example of silicon carbide of the 4H type in terms of polytype. However, silicon carbide of other polytypes, such as of the 6H type and of the 3C type, may be used. Furthermore, the descriptions have been provided for all of the structures, giving the example of the transistor with what is termed as the vertical structure, in which the drain electrode 7 and the source electrode 6 are arranged opposite to each other with the drain region 2 interposed between the drain electrode 7 and the source electrode 6, and the drain current is caused to flow in the vertical direction. However, a transistor with what is termed as the horizontal structure may be used, in which, for example, the drain electrode 7 and the source electrode 6 are arranged on the same single major surface, and the drain current is caused to flow in the horizontal direction.

Moreover, the descriptions have been provided for all of the structures, giving the example of use of polycrystalline silicon as the material used for forming the hetero semiconductor region 3 and the second hetero semiconductor region 8. However, no matter what material may be used as long as the material makes a hetero-junction with silicon carbide. Additionally, the descriptions will be provided for all of the structures, giving the example of use of $n^-$ silicon carbide for the drain region 2, and of use of $n^-$ polycrystalline silicon for the hetero semiconductor region 3. However, any one of the following combined uses may be applied to all of the structures: combined use of $n^-$ silicon carbide for the drain region 2 and $p^-$ polycrystalline silicon for the hetero semiconductor region 3; combined use of $p^-$ silicon carbide for the drain region 2 and $p^-$ polycrystalline silicon for the hetero semiconductor region 3; and combined use of $p^-$ silicon carbide for the drain region 2 and $n^-$ polycrystalline silicon for the hetero semiconductor region 3.

Other Embodiments

Descriptions will be provided for an example of a method of manufacturing the silicon carbide semiconductor device with the well region 45 according to the second embodiment, referring FIGS. 23A to 23F.

Figure 23A:
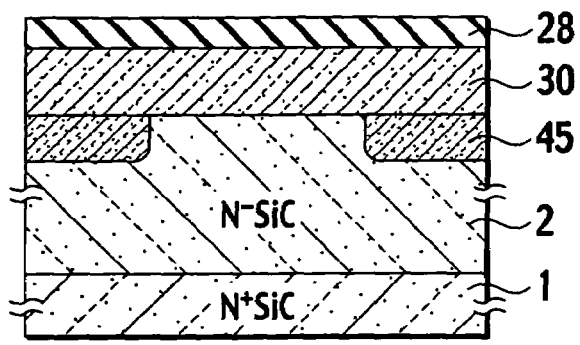
FIGS. 23A to 23F are cross-sectional views of the semiconductor device of the second embodiment, showing fabrication processes.

At first, as shown in FIG. 23A, the $n^-$ drain region 2 is epitaxially grown on the $n^+$ silicon carbide substrate 1, and thus an $n^-$ silicon carbide semiconductor substrate body (1,2) is formed. Then, a mask layer is formed selectively on the $n^-$ silicon carbide semiconductor substrate body (1,2) through a photolithography process and an etching process. Thereafter p-type impurity, for example, boron impurities are introduced into the $n^-$ silicon carbide semiconductor substrate body through the mask layer. Thence, the region into which the impurities are introduced is annealed in order to activate the region into which the impurities are introduced. Through this annealing process, a well region 45 is formed. Afterwards, the first polycrystalline silicon layer 30 is doped with boron. Thus, an $n^-$ first polycrystalline silicon layer 30 is formed. An oxidation inhibiting film 28 made of a silicon nitride film is deposited on the first polycrystalline silicon layer 30.

Figure 23B:
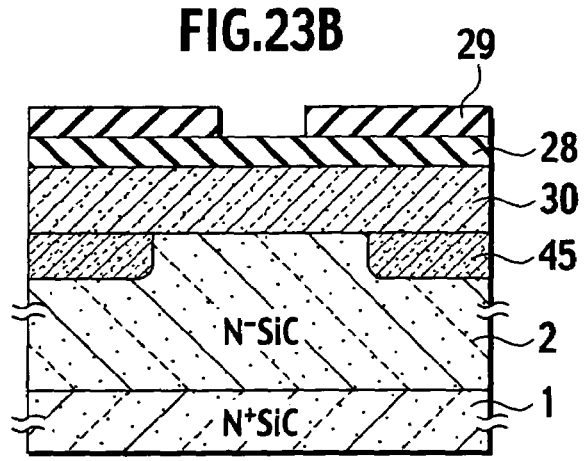
Figure 23C:
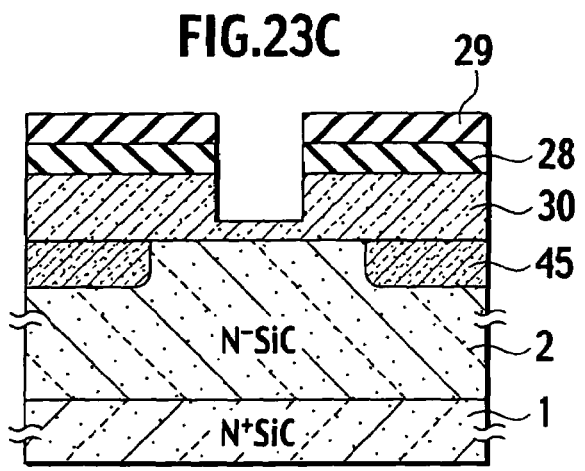
Figure 23D:
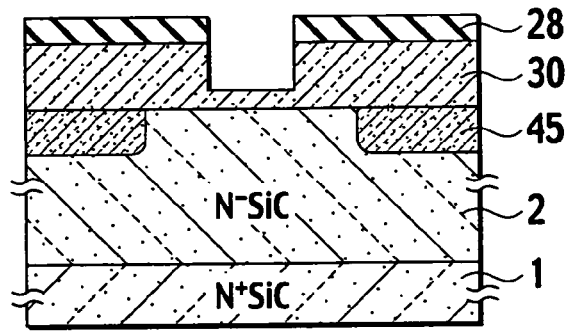
Figure 23E:
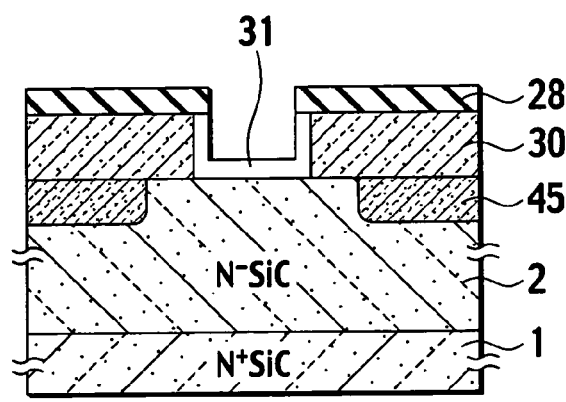

Thence, as shown in FIG. 23B, a mask layer 29 is formed on the oxidation inhibiting film 28 by use of a photolithography process and an etching process. Thereafter in FIG. 23C, the oxidation inhibiting film 28 and the first polycrystalline silicon layer 30 are etched through the mask layer, for example, by use of a reactive ion etching process. Thereby, the groove with a predetermined depth is formed. Incidentally, another etching process, such as a wet etching process, may be used as a method of etching the first polycrystalline silicon layer 30. The mask layer 29 is removed as shown in FIG. 23D.

Parts of the first polycrystalline silicon layer 30, which parts are not coated with the oxidation inhibiting film 28, are thermally oxidized, and thus the oxidized film 31 is formed.

Figure 23F:
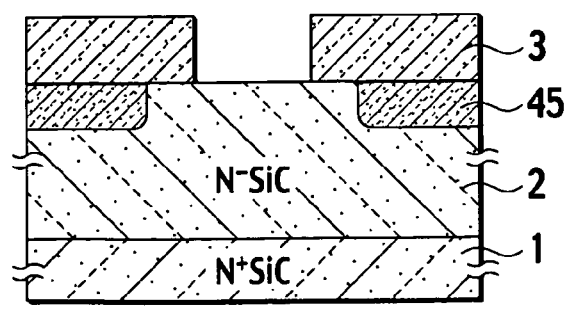

As shown in FIG. 23F, the oxidation inhibiting film 28 is removed, for example, by use of a phosphoric acid solution. Thereafter, the oxidized film 31 which has been formed is removed.

Afterwards, the gate insulating film is deposited along the inside surface of a groove constituted of a part of the top surface of the drain region 2 and the side wall of the corresponding etched part of the hetero semiconductor region 3. Then, a polycrystalline silicon layer which will later constitute the gate electrode is deposited on the gate insulating film. Thereafter, phosphorus is added into the polycrystalline silicon layer.

The entire contents of a Patent Application No. TOKUGAN 2004-280950, a Patent Application No. TOKUGAN 2004-281661 and a Patent Application No. TOKUGAN 2004-281700 with a filing date of Sep. 28, 2004 in Japan are hereby incorporated by reference.

Although the invention has been described above by reference to certain embodiments of the invention, the invention is not limited to the embodiments described above. Modifications and variations of the embodiments described above will occur to those skilled in the art, in light of the teachings. The scope of the invention is defined with reference to the following claims.

What is claimed is:

1. A method of manufacturing a semiconductor device which comprises: a semiconductor substrate body; a hetero semiconductor region which is in contact with a major surface of the semiconductor substrate body, and whose bandgap is different from that of the semiconductor substrate body; a gate electrode arranged in a junction part between the hetero semiconductor region and the semiconductor substrate body with a gate insulating film interposed between the gate electrode and the junction part; a source electrode connected to the hetero semiconductor region; and a drain electrode ohmically connected with the semiconductor substrate body, the method comprising:
    forming a hetero semiconductor layer on at least the major surface of the semiconductor substrate body of a first conductivity type;
    etching the hetero semiconductor layer selectively by use of a mask layer having openings such that a predetermined thickness of the hetero semiconductor layer remains at the openings;
    oxidizing a portion of the hetero semiconductor layer to form an oxidized film thereon;
    forming the hetero semiconductor region by etching the oxidized film; and
    forming the gate insulating film such that the gate insulating film makes an intimate contact with the hetero semiconductor region and the semiconductor substrate body.

2. The method of claim 1, wherein the predetermined thickness is such that etching damage introduced into the hetero semiconductor layer does not reach the major surface of the semiconductor substrate body.

3. The method of claim 1, wherein a part of the semiconductor substrate body, which part is in contact with the hetero semiconductor layer, is oxidized simultaneously in the oxidizing.

4. The method of claim 1, wherein the oxidizing is performed by use of a thermal oxidation.

5. The method of claim 1, further comprising forming an oxidation inhibiting layer on the hetero semiconductor layer between the forming the hetero semiconductor layer and the etching.

6. The method of claim 5, wherein the oxidation inhibiting film and the hetero semiconductor layer are sequentially etched while the oxidation inhibiting layer and the hetero semiconductor layer have the mask layer thereon.

7. The method of claim 1, further comprising introducing impurities into at least a part of the hetero semiconductor region.

8. The method of claim 1, wherein the semiconductor substrate body is made of silicon carbide.

9. The method of claim 1, wherein the hetero semiconductor region is made of at least one of monocrystalline silicon, polycrystalline silicon, and amorphous silicon.

10. The method of claim 1, further comprising forming the gate electrode with a semiconductor material of a second conductivity type.

11. The method of claim 1, further comprising forming a well region of a second conductivity type in a part of the semiconductor substrate body.

* * * * *